(12) United States Patent
Jeong et al.

(10) Patent No.: US 8,785,901 B2
(45) Date of Patent: Jul. 22, 2014

(54) SEMICONDUCTOR DEVICES HAVING METAL OXIDE PATTERNS

(71) Applicant: Samsung Electronics Co., Ltd., Suwon-si (KR)

(72) Inventors: Junho Jeong, Suwon-si (KR); Sukhun Choi, Suwon-si (KR); Jangeun Lee, Suwon-si (KR); Kyunghyun Kim, Seoul (KR); Sechung Oh, Suwon-si (KR); Kyungtae Nam, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/875,731

(22) Filed: May 2, 2013

(65) Prior Publication Data

US 2013/0241037 A1     Sep. 19, 2013

Related U.S. Application Data

(63) Continuation of application No. 12/725,647, filed on Mar. 17, 2010, now Pat. No. 8,435,830.

(30) Foreign Application Priority Data

Mar. 18, 2009  (KR) .................. 10-2009-0023162
Sep. 3, 2009   (KR) .................. 10-2009-0083119

(51) Int. Cl.
| | |
|---|---|
| H01L 27/24 | (2006.01) |
| H01L 45/00 | (2006.01) |
| H01L 27/10 | (2006.01) |
| H01L 21/768 | (2006.01) |
| H01L 49/02 | (2006.01) |
| H01L 43/12 | (2006.01) |

(52) U.S. Cl.
CPC ............ *H01L 28/20* (2013.01); *H01L 27/2409* (2013.01); *H01L 27/2436* (2013.01); *H01L 45/04* (2013.01); *H01L 45/1625* (2013.01); *H01L 45/126* (2013.01); *H01L 45/1233* (2013.01); *H01L 45/147* (2013.01); *H01L 45/144* (2013.01); *H01L 45/1616* (2013.01); *H01L 27/101* (2013.01); *H01L 45/06* (2013.01); *H01L 21/7684* (2013.01); *H01L 45/08* (2013.01); *H01L 43/12* (2013.01); *H01L 45/1641* (2013.01); *H01L 45/085* (2013.01); *H01L 45/143* (2013.01)
USPC .. 257/4; 257/752; 257/E27.004; 257/E45.003

(58) Field of Classification Search
CPC ... H01L 27/24; H01L 29/456; H01L 45/1233; H01L 45/126
USPC ................. 257/4, 752, E27.004, E45.003
See application file for complete search history.

(56) References Cited

U.S. PATENT DOCUMENTS

| | | | |
|---|---|---|---|
| 6,207,570 B1 | 3/2001 | Mucha | 438/692 |
| 6,326,293 B1 | 12/2001 | Fang et al. | 438/597 |

(Continued)

FOREIGN PATENT DOCUMENTS

| | | |
|---|---|---|
| JP | 2006-054458 | 2/2006 |
| JP | 2008-098365 | 4/2008 |

(Continued)

*Primary Examiner* — Zandra Smith
*Assistant Examiner* — Toniae Thomas
(74) *Attorney, Agent, or Firm* — Myers Bigel Sibley & Sajovec

(57) ABSTRACT

Methods of fabricating semiconductor devices are provided including forming a dielectric interlayer on a substrate, the dielectric interlayer defining an opening therein. A metal pattern is formed in the opening. An oxidization process is performed on the metal pattern to form a conductive metal oxide pattern, and the conductive metal oxide pattern is planarized. Related semiconductor devices are also provided.

10 Claims, 16 Drawing Sheets

(56) References Cited

U.S. PATENT DOCUMENTS

| | | | |
|---|---|---|---|
| 6,682,943 B2 | 1/2004 | Durcan et al. | |
| 6,952,364 B2 | 10/2005 | Lee et al. | |
| 2002/0038872 A1* | 4/2002 | Lowrey et al. | 257/178 |
| 2004/0038445 A1* | 2/2004 | Lowrey et al. | 438/103 |
| 2007/0246787 A1 | 10/2007 | Wang et al. | |
| 2008/0185670 A1 | 8/2008 | Kajiyama | |
| 2008/0247219 A1* | 10/2008 | Choi et al. | 365/148 |
| 2008/0308784 A1* | 12/2008 | Oh et al. | 257/4 |
| 2010/0203725 A1 | 8/2010 | Choi et al. | 438/663 |
| 2010/0301480 A1 | 12/2010 | Choi et al. | 257/751 |
| 2011/0089393 A1 | 4/2011 | Chang et al. | 257/4 |
| 2011/0207318 A1 | 8/2011 | Usami | 438/653 |
| 2011/0312126 A1 | 12/2011 | Bae et al. | 438/102 |

FOREIGN PATENT DOCUMENTS

| | | |
|---|---|---|
| KR | 1020020054655 A | 7/2002 |
| KR | 1020040075025 A | 8/2004 |
| KR | 1020060013996 A | 2/2006 |

* cited by examiner

SEMICONDUCTOR DEVICES HAVING METAL OXIDE PATTERNS

CLAIM OF PRIORITY

This application is a continuation of U.S. application Ser. No. 12/725,647, filed Mar. 17, 2010, which claims priority to Korean Patent Application No. 10-2009-0023162, filed Mar. 18, 2009, and to Korean Patent Application No. 10-2009-0083119, filed Sep. 3, 2009, the contents of which are hereby incorporated herein by reference as if set forth in their entirety.

FIELD

The present invention relates to semiconductor devices and methods for fabricating the same and, more particularly, to semiconductor devices having miniaturized patterns and related methods of fabricating the same.

BACKGROUND

Due to their small-size, multifunctional and/or low-cost characteristics, semiconductor devices are being esteemed as important elements in the electronic industry. Some semiconductor devices may include a memory device for storing data, a logic device for processing data, and a hybrid device capable of performing various functions simultaneously.

A demand for the high integration of semiconductor devices is increasing with the development of the electronic industry. Accordingly, various problems may arise due to the decreasing size of the device, thus making fabrication of semiconductor devices more difficult. For example, the process margins of an exposure process and an etch process for defining patterns of semiconductor devices are decreasing due to the decreasing size of the patterns. Furthermore, various types of steps are caused by the density and complexity of the patterns, and it is becoming more difficult to planarize such steps. Moreover, the characteristics of miniaturized patterns are becoming very sensitive to peripheral environments. For example, the characteristics of miniaturized patterns are increasingly depending on the physical states, such as shapes and surface roughness and chemical states, such as material types, of peripheral material layers or peripheral patterns. The miniaturization of patterns makes it difficult to form the patterns to have their respective characteristics.

SUMMARY

In some embodiments of the inventive concept, methods for fabricating a semiconductor device include: forming a dielectric interlayer on a substrate, the dielectric interlayer defining an opening therein; forming a metal pattern in the opening; performing an oxidization process on the metal pattern to form a conductive metal oxide pattern; and planarizing the conductive metal oxide pattern.

In further embodiments, the method may further include performing a reduction process on the planarized conductive metal oxide pattern. The reduction process may be performed in a hydrogen atmosphere or in a hydrogen/nitrogen atmosphere.

In still further embodiments, the planarizing of the conductive metal oxide pattern may include planarizing an upper portion of the conductive metal oxide pattern and an upper portion of the dielectric interlayer.

In some embodiments, the method may further include forming a barrier pattern between the inner surface of the opening and the metal pattern.

In further embodiments, an upper portion of the barrier pattern may be oxidized in the oxidization process, and at least a portion of the oxidized portion of the barrier pattern may be removed in the planarizing of the conductive metal oxide pattern.

In still further embodiments, the method may further include forming a capping dielectric layer on the substrate after the forming of the conductive metal oxide pattern, wherein the conductive metal oxide pattern includes a portion protruding outside the opening, and the planarizing of the conductive metal oxide pattern includes planarizing the protruding portion of the conductive metal oxide pattern and the capping dielectric layer. In these embodiments, the methods may further include forming a barrier pattern between the inner surface of the opening and the metal pattern. Herein, the planarized capping dielectric layer may cover the barrier pattern.

In some embodiments, the conductive metal oxide pattern may be planarized by a chemical mechanical polishing (CMP) process.

In further embodiments, the method may further include forming a lower electrode layer on the planarized conductive metal oxide pattern, wherein the lower electrode layer is in an amorphous.

In still further embodiments, the methods may further include performing a partial planarization process on the lower electrode layer. Herein, the partial planarization process may be performed through a CMP process.

In some embodiments, the method may further include forming a variable resistor electrically connected to the planarized conductive metal oxide pattern. Herein, the metal pattern, the planarized conductive metal oxide pattern, and the variable resistor may be stacked in a direction perpendicular to the top surface of the substrate, and at least a portion of the metal pattern, at least a portion of the planarized conductive metal oxide pattern, and at least a portion of the variable resistor may overlap with each other in the perpendicular direction.

In further embodiments, the variable resistor may directly contact the top surface of the planarized conductive metal oxide pattern.

In still further embodiments, the method may further include forming a lower electrode layer on the planarized conductive metal oxide pattern before the forming of the variable resistor, wherein the lower electrode layer is in an amorphous. In these embodiments, the method may further include performing a partial planarization process on the lower electrode layer before the forming of the variable resistor.

In some embodiments of the inventive concept, semiconductor devices may include: a dielectric layer on a substrate; a metal pattern in the dielectric layer; a conductive metal-containing pattern on the metal pattern, including the same metal as the metal pattern, and having a planarized top surface being coplanar with a top surface of the dielectric layer; and a variable resistor on the conductive metal-containing pattern and electrically connected to the conductive metal-containing pattern.

In further embodiments, the conductive metal-containing pattern may include a conductive metal oxide pattern adjacent to the metal pattern and an upper metal pattern on the conductive metal oxide pattern. Herein, the oxygen concentration of the conductive metal oxide pattern may be higher than the oxygen concentration of the upper metal pattern.

In still further embodiments, the upper metal pattern may further include nitrogen.

In some embodiments, the semiconductor device may further include a barrier pattern between the dielectric layer and the metal pattern. In these embodiments, the dielectric layer may include: a dielectric interlayer surrounding a sidewall of a lower portion of the conductive metal-containing pattern and a sidewall of the metal pattern; and a capping dielectric layer surrounding a sidewall of an upper portion of the conductive metal-containing pattern. Herein, the capping dielectric layer may cover the barrier pattern.

In further embodiments, the variable resistor may change into a plurality of resistance states having different associated resistivities, and the resistivity of the conductive metal-containing pattern may be lower than the lowest among the resistivities of the resistance states.

In still further embodiments of the inventive concept, semiconductor devices may include: a dielectric layer on a substrate; a first metal pattern in the dielectric layer; a second metal pattern on the first metal pattern, including the same metal as the first metal pattern, and having a planarized top surface being coplanar with a top surface of the dielectric layer; and a variable resistor on the second metal pattern and electrically connected to the second metal pattern. Herein, the grain size of the second metal pattern may be smaller than the grain size of the first metal pattern.

In some embodiments, the second metal pattern may further include nitrogen.

In further embodiments, the second metal pattern may further include oxygen.

DETAILED DESCRIPTION OF THE EMBODIMENTS

Figure 1A:
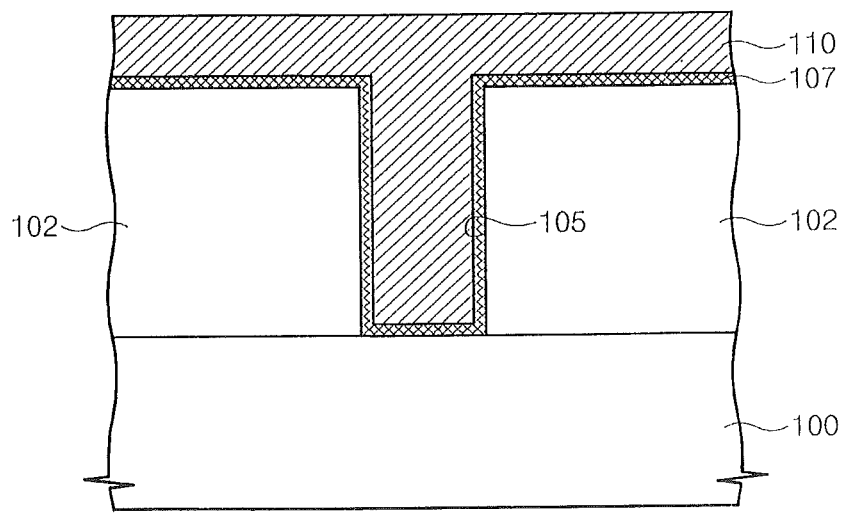
FIGS. 1A to 1I are cross-sections illustrating processing steps in the fabrication of semiconductors devices according to some embodiments of the inventive concept.

Various example embodiments will be discussed more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements discussed as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring to FIGS. 1A to 1I, cross sections illustrating processing steps in the fabrication semiconductor devices according to some embodiment of the inventive concept will be discussed. As illustrated in FIG. 1A, a dielectric interlayer 102 is formed on a semiconductor substrate (hereinafter simply referred to as substrate) 100. The dielectric interlayer 102 is patterned to form an opening 105. Before the forming of the dielectric interlayer 102, a switching device (not shown) may be formed in the substrate 100. For example, the switching device may be a PN diode or a MOS transistor. The opening 105 may expose one terminal of the switching device (e.g., one terminal of a PN diode or a source or drain of a MOS transistor). Unlike this, the opening 105 may expose a conductive pad (not shown) or a conductive plug (not shown) connected to one terminal of the switching device. The opening 105 may be formed in the shape of a hole. According to an exemplary embodiment, the opening 105 may be formed in the shape of a groove.

The dielectric interlayer 102 may include oxide. For example, the dielectric interlayer 102 may include silicon oxide, germanium oxide and/or silicon-germanium oxide. A barrier layer 107 may be conformally formed on the substrate 100 including the opening 105. The barrier layer 107 may be formed on the inner surface of the opening 105 and the top surface of the dielectric interlayer 102. A metal layer 110 may be formed on the barrier layer 107 to fill the opening 105. The barrier layer 107 may reduce the reaction between the metal layer 110 and the dielectric interlayer 102. Furthermore, the barrier layer 107 may reduce the likelihood that metal atoms of the metal layer 110 will diffuse into the dielectric interlayer 102. The barrier layer 107 may have conductivity. For example, the barrier layer 107 may include a titanium layer, a tantalum layer and/or a conductive metal layer, for example, a titanium nitride layer and a tantalum nitride layer. The metal layer 110 may include transition metal. For example, the metal layer 110 may include tungsten, titanium, tantalum and/or nickel. The metal layer 110 may be formed in a crystalline state with grains of a predetermined size.

Figure 1B:
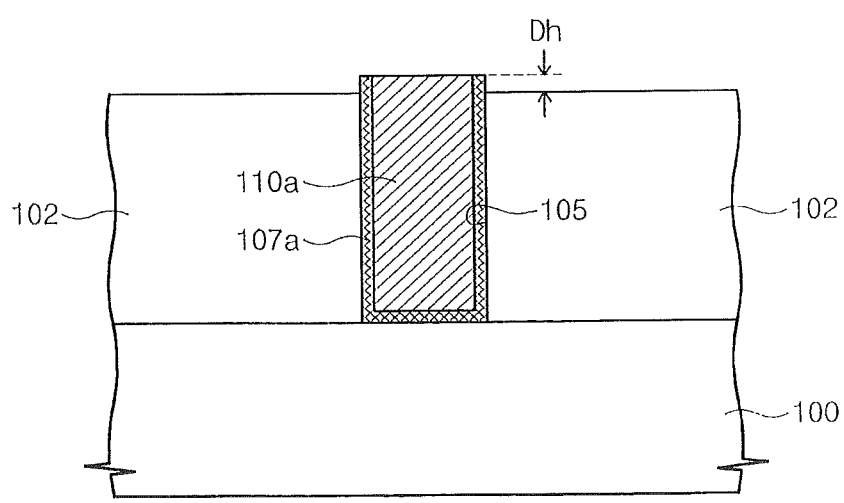

Referring to FIG. 1B, a first planarization process is performed on the meal layer 110 and the barrier layer 107 to expose the dielectric interlayer 102. Accordingly, a barrier pattern 107a and a metal pattern 110a are formed in the opening 105. The metal pattern 110a and the barrier pattern 107a may be electrically connected to one terminal of the switching device. The first planarization process may be performed by a chemical mechanical polishing (CMP) process. The metal layer 110 may be formed of metal and the dielectric interlayer 102 may be formed of dielectric (e.g., oxide), so that the etch rate of the metal layer 110 may be different from the etch rate of the dielectric interlayer 102.

The first planarization process may include a first sub planarization process and a second sub planarization process. In the first sub planarization process, the etch rate of the metal layer 110 may be higher than the etch rate of the dielectric interlayer 102. Accordingly, after the first sub planarization process, the top surface of the metal pattern 110a may lower than the top surface of the dielectric interlayer 102. Herein, a height difference between the top surface of the metal pattern 110a and the top surface of the dielectric interlayer 102 may be about 100 Å to about 150 Å.

The second sub planarization process may be performed after the first sub planarization process. In the second sub planarization process, the etch rate of the metal layer 110 may be lower than the etch rate of the dielectric interlayer 102. Accordingly, after the second sub planarization process, the top surface of the dielectric interlayer 102 may lower than the top surface of the metal pattern 110a. FIG. 1B illustrates a state after completion of the second sub planarization process. Herein, a height difference between the top surface of the metal pattern 110a and the top surface of the dielectric interlayer 102 may be about 100 Å to about 150 Å. In some embodiments, the first planarization process may include only the first sub planarization process without including the second sub planarization process without departing from the scope of the inventive concept.

Figure 1C:
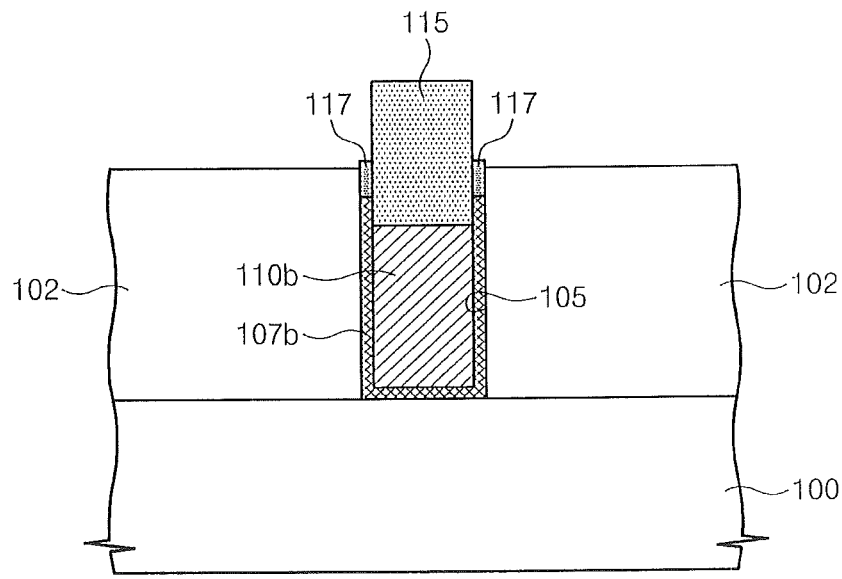

Referring to FIG. 1C, an oxidization process is performed on the metal pattern 110a. Accordingly, an upper portion of the metal pattern 110a is oxidized to form a conductive metal oxide pattern 115. A lower portion 110b of the metal pattern 110a remains beneath the conductive metal oxide pattern 115. The top surface of the remaining metal pattern 110b may be lower than the top surface of the dielectric interlayer 102. The conductive metal oxide pattern 115 may have a portion that protrudes outside the opening 105. That is, a lower portion of the conductive metal oxide pattern 115 may be located in an upper portion of the opening 105, and an upper portion of the conductive metal oxide pattern 115 may protrude outside the opening 105.

As discussed above, if the first planarization process includes only the first sub planarization process, the top surface of the metal pattern 110a may be lower than the top surface of the dielectric interlayer 102. In these embodiments, during the oxidization process, the conductive metal oxide pattern 115 may grow in random directions.

On the other hand, if the first planarization process includes the first and second sub planarization processes, the top surface of the metal pattern 110a of FIG. 1B may be higher than the top surface of the dielectric interlayer 102. In these embodiments, during the oxidization process, the conductive meal oxide pattern 115 may grow in a direction substantially perpendicular to the top surface of the substrate 100. FIG. 1C illustrates a state after completion of the oxidization process if the first planarization process includes the first and second sub planarization processes.

The conductive metal oxide pattern 115 includes the same metal as the remaining meal pattern 110b because the conductive metal oxide pattern 115 is formed by oxidization of the metal pattern 110a. The conductive metal oxide pattern 115 has electric conductivity. To this end, the conductive metal oxide pattern 115 may be in a stoichiometrically metal-rich state. For example, if the metal pattern 110a of FIG. 1B includes tungsten, the conductive metal oxide pattern 115 may be formed of W-rich tungsten oxide. In the conductive metal oxide pattern 115, the tungsten content may be equal to or higher than the oxygen content. For example, the tungsten/oxygen content ratio in the conductive metal oxide pattern 115 may be about 1:1 to about 5:1.

The oxidization process may be performed through an oxygen-atmosphere rapid thermal treatment process or an oxygen plasma treatment process. Accordingly, the conductive metal oxide pattern 115 may be in a stoichiometrically oxygen-poor (i.e., metal-rich) state. The process temperature of the oxygen-atmosphere rapid thermal treatment process may be about 300° C. to about 700° C. The process time of the oxygen-atmosphere rapid thermal treatment process may be about 1 minute to about 60 minutes. The plasma power of the oxygen plasma treatment process may be about 20 W to about 100 W. The process time of the oxygen plasma treatment process may be about 1 minute to about 60 minutes. The process gas of the oxidization process may include oxygen ($O_2$) gas or ozone ($O_3$) gas. In the oxidization process, oxygen gas may be supplied at a flow rate of about 500 sccm or more. However, the inventive concept is not limited thereto, and the process conditions of the oxidization process may vary according to embodiments.

The barrier pattern 107a may be oxidized in the oxidization process. In these embodiments, a barrier pattern 107b remains beneath an oxidized portion 117 of the barrier pattern. The bottom surface of the oxidized portion 117 of the barrier pattern may be lower than the top surface of the dielectric interlayer 102. Furthermore, a portion of the oxidized portion 117 of the barrier pattern may protrude outside the opening 105. In the oxidization process, the oxidization rate of the barrier pattern 110a may be lower than the oxidization rate of the metal pattern 110a. Accordingly, the top surface of the oxidized portion 117 of the barrier pattern may be lower than the top surface of the conductive metal oxide pattern 115.

According to some embodiments, if the barrier pattern 110a is formed of conductive metal nitride, the barrier pattern 110a may not be substantially oxidized.

Figure 1D:
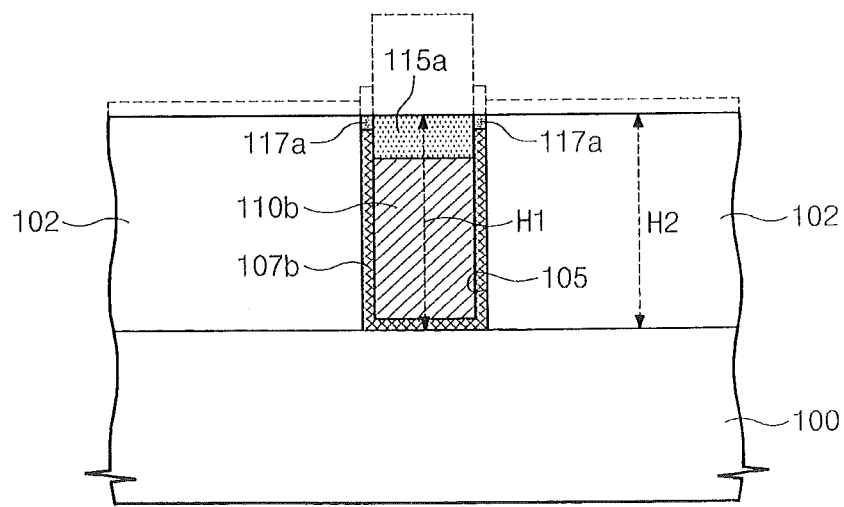

Referring to FIG. 1D, a second planarization process is performed on the conductive metal oxide pattern 115. The second planarization process may be performed through a CMP process. An upper portion of the conductive metal oxide pattern 115 and an upper portion of the dielectric interlayer 102 may be planarized through the second planarization process. Specifically, in the second planarization process, a protruding portion of the conductive metal oxide pattern 115 is removed, and then an upper portion of the dielectric interlayer 102 and the conductive metal oxide pattern 115 in an upper portion of the opening 105 may be planarized simultaneously. Accordingly, the top surface of the planarized conductive metal oxide pattern 115a may be coplanar with the top surface of the planarized dielectric interlayer 102. As discussed above, after the second planarization process, the planarized conductive metal oxide pattern 115a remains in the opening 105. The conductive metal oxide pattern 115 may be a kind of oxide. Accordingly, in the second planarization process, a difference between the etch rate of the conductive metal oxide pattern 115 and the etch rate of the dielectric interlayer 102 may be reduced. In particular, the etch rate of the oxide-containing dielectric interlayer 102 by the second planarization process may be substantially identical to the etch rate of the conductive metal oxide pattern 115 by the second planarization process. Consequently, a planarized surface including the top surfaces of the planarized conductive metal oxide pattern 115a and the planarized dielectric interlayer 102 may have very good flatness. The center of the planarized conductive metal oxide pattern 115a is located at a first height H1 from the top surface of the substrate 100, and the top surface of the planarized dielectric interlayer 102 is located at a second height H2 from the top surface of the substrate 100. A difference between the first height H1 and the second height H2 may be equal to or greater than about 0 Å and equal to or smaller than about 50 Å. Preferably, the difference between the first height H1 and the second height H2 may be equal to or greater than about 0 Å and equal to or smaller than about 10 Å.

In the second planarization process, at least a portion of the oxidized portion 117 of the barrier pattern may be planarized simultaneously with the conductive metal oxide pattern 115 and the dielectric interlayer 102. In these embodiments, the oxidized portion 117 of the barrier pattern is also included in the oxide, thereby minimizing the difference between the etch rate of the oxidized portion 117 of the barrier pattern and the etch rate of the dielectric interlayer 102. For example, in the second planarization process, the etch rate of the oxidized portion 117 of the barrier pattern may be substantially identical to the etch rate of the dielectric interlayer 102. Consequently, after the second planarization process, a planarized surface including the top surfaces of the planarized conductive metal oxide pattern 115a, the planarized oxidized portion 117a of the barrier pattern and the planarized dielectric interlayer 102 may have very good flatness. According to some embodiments, all of the oxidized portion 117 of the barrier pattern may be removed in the second planarization process.

After the second planarization process, a cleaning process may be performed on the planarized surface. The cleaning process may be performed using a cleaning solution containing acid chemicals including fluoric acid and/or sulfuric acid.

Figure 1E:
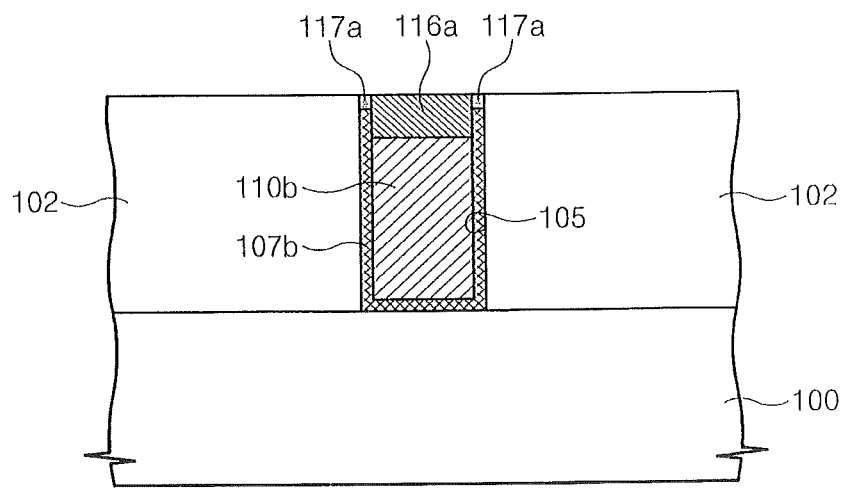

Referring to FIG. 1E, a reduction process is performed on the planarized conductive metal oxide pattern 115a. Through the reduction process, the planarized conductive metal oxide pattern 115a may be reduced to form an upper metal pattern 116a. The reduction process may deoxidize the planarized conductive metal oxide pattern 115a. Accordingly, the upper metal pattern 116a may have a lower oxygen concentration than the planarized conductive metal oxide pattern 115a. That is, the upper metal pattern 116a may be in a stoichiometrically metal-richer state than the planarized conductive metal oxide pattern 115a. Accordingly, the upper metal pattern 116a may have a lower resistivity than the planarized conductive metal oxide pattern 115a.

The oxygen content of the upper metal pattern 116a may depend on the process conditions of the reduction process. That is, if the reduction process on the planarized conductive metal oxide pattern 115a is performed sufficiently, the upper metal pattern 116a may not substantially contain oxygen. On the other hand, if the reduction process on the planarized conductive metal oxide pattern 115a is performed insufficiently within a short time, the oxygen content of the upper metal pattern 116a may be somewhat high. However, also in these embodiments, the oxygen content of the upper metal pattern 116a may be lower than the oxygen content of the planarized conductive metal oxide pattern 115a.

The upper metal pattern 116a may contain the same metal as the remaining metal pattern 110b. The upper metal pattern 116a may contain crystalline metal. The size of grains in the upper metal pattern 116a may be smaller than the size of grains in the remaining metal pattern 110b. Accordingly, the resistivity of the upper metal pattern 116a may be higher than the resistivity of the remaining metal pattern 110b.

Figure 1F:
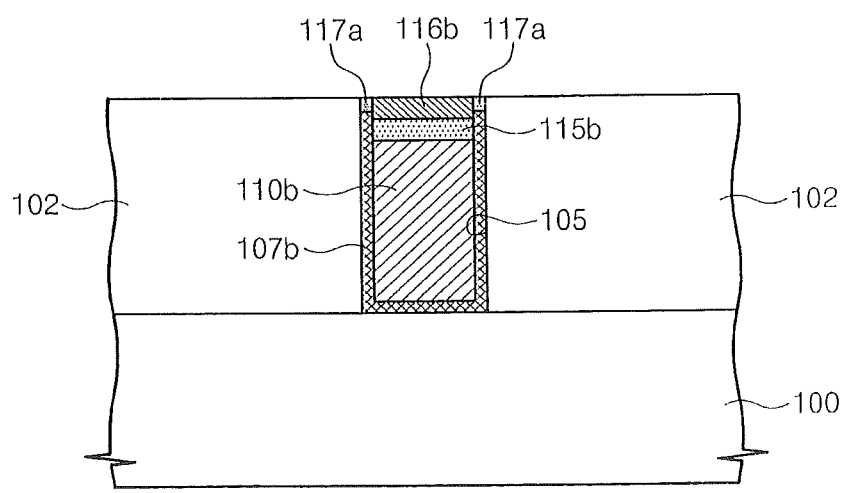

Unlike the illustration of FIG. 1E, only a portion of the planarized conductive metal oxide pattern 115a may be reduced by the reduction process. Referring to FIG. 1F, only an upper portion of the planarized conductive metal oxide pattern 115a may be reduced to form an uppermost metal pattern 116b. Accordingly, a lower portion of the planarized conductive metal oxide pattern 115a may remain as a lower metal oxide pattern 115b without reduction, and may be between the uppermost metal pattern 116b and the remaining metal pattern 110b. In these embodiments, the lower metal oxide pattern 115b may have a higher resistivity than the remaining metal pattern 110b and the uppermost metal pattern 116b. In these embodiments, the uppermost metal pattern 116b and the lower metal oxide pattern 115b may be applied instead of the upper metal pattern 116a.

The reduction process may be performed through a rapid thermal treatment process or a hydrogen plasma treatment process. The process temperature of the rapid thermal treatment process may be about 300° C. to about 1000° C. The rapid thermal treatment process may be performed for about 1 minute to about 120 minutes. The plasma power of the hydrogen plasma treatment process may be about 20 W to about 100 W. The process time of the hydrogen plasma treatment process may be about 1 minute to about 120 minutes.

The reduction process may be performed in a hydrogen atmosphere. The hydrogen gas used in the reduction process may be a reductant for the conductive metal oxide of the planarized conductive metal oxide pattern 115a. Unlike this, the reduction process may be performed in a hydrogen/nitrogen atmosphere. For example, the process gas of the reduction process may include hydrogen gas ($H_2$) and/or ammonia gas ($NH_3$). If the reduction process is performed using the hydrogen gas as the process gas, the upper metal pattern 116a may further contain nitrogen. As illustrated in FIG. 1F, if only an upper portion of the planarized conductive metal oxide pattern 115a is reduced, the uppermost metal pattern 116b may contain nitrogen. The oxidized portion 117 of the barrier pattern may also be reduced in the reduction process.

Figure 1G:
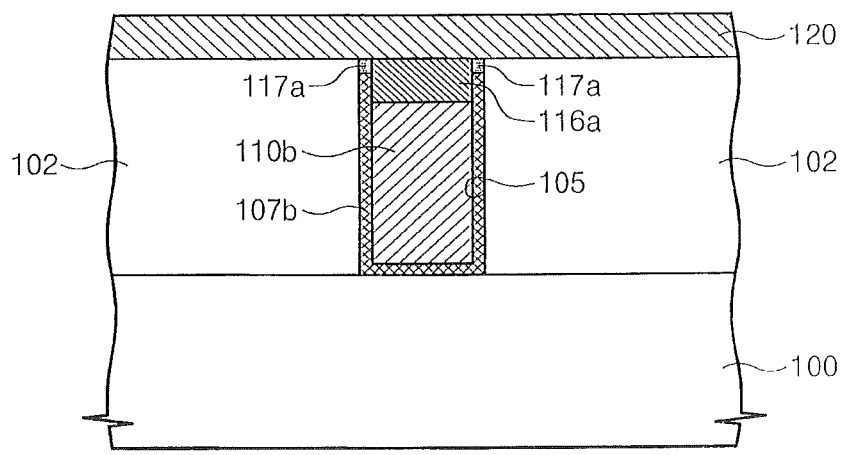

Referring to FIG. 1G, a lower electrode layer 120 may be formed on the substrate 100. The lower electrode layer 120 may be in an amorphous state. The lower electrode layer 120 may be formed of metal-containing conductive material. For example, the lower electrode layer 120 may include an amorphous conductive metal nitride layer (e.g., a titanium nitride layer and a tantalum nitride layer). Before the forming of the lower electrode layer 120, an interfacial barrier layer (e.g., Ti and Ta) may be formed on the substrate 100 including the planarized conductive metal oxide pattern 115a.

Figure 1H:
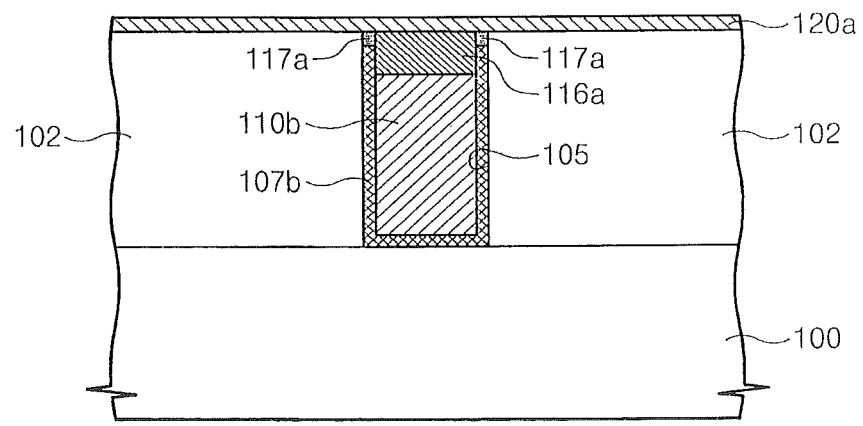

Referring to FIG. 1H, a partial planarization process may be performed on the amorphous lower electrode layer 120. The partial planarization process may be performed through a CMP process. Through the partial planarization process, an upper portion of the lower electrode layer 120 may be removed and the top surface of the planarized lower electrode layer 120a may have very good flatness. The partial planarization process may have a low etch rate of abut 1 Å/second to about 50 Å/second. Preferably, the partial planarization process may have a low etch rate of about 10 Å/second to about 150 Å/second. According to some embodiments, the partial planarization process may be omitted.

Figure 1I:
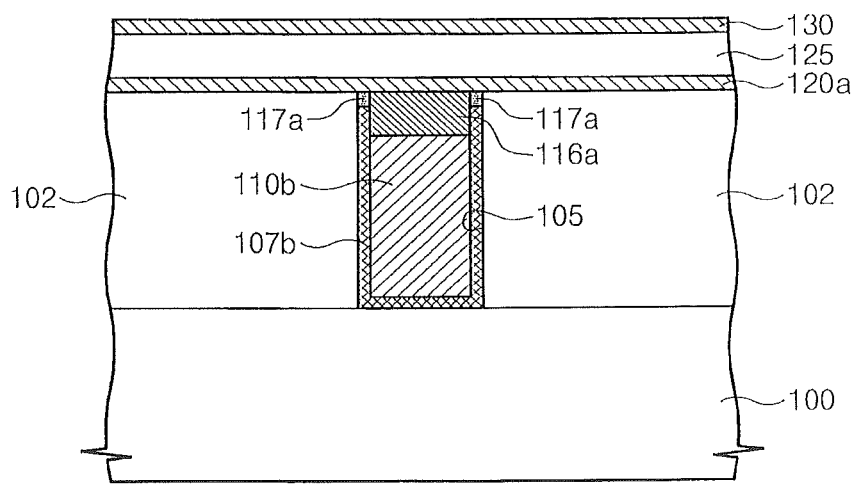

Referring to FIG. 1I, a variable resistor layer 125 and an upper electrode layer 130 may be sequentially formed on the planarized lower electrode layer 120a. The variable resistor layer 125 may be single-layered or multi-layered. For example, the variable resistor layer 125 may be formed through a chemical vapor deposition (CVD) process, a physical vapor deposition (PVD) process, and/or an atomic layer epitaxy (ALE) process. The planarized lower electrode layer 120a is in an amorphous state. Accordingly, it is possible to reduce the likelihood of the abnormal growth of the variable resistor layer 125. Consequently, it is possible to implement the variable resistor layer 125 with good characteristics.

The variable resistor layer 125 may be formed of single-layered or multi-layered material that can change into a plurality of states with different resistivities. For example, the variable resistor layer 125 may include a magnetic tunnel junction layer, a phase-change material layer, or a material layer capable of creating/destroying filaments. These embodiments will be discussed further below. The upper electrode layer 130 may include a conductive metal nitride layer, for example, a titanium nitride layer and a tantalum nitride layer, and/or a precious metal layer.

Figure 3:
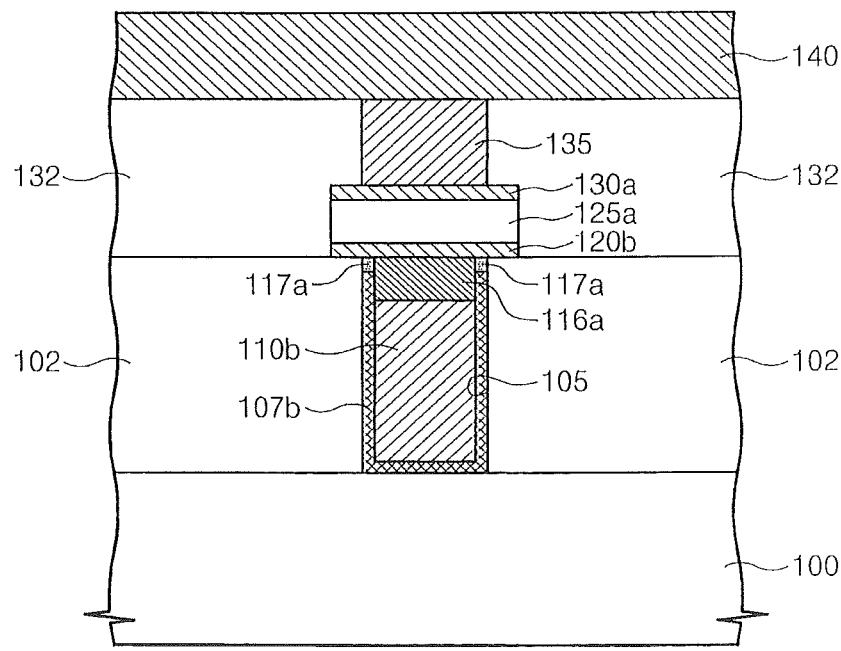
FIG. 3 is a cross-section of a semiconductor device according to some embodiments of the inventive concept.

The upper electrode layer 130, the variable resistor layer 125, and the planarized lower electrode layer 120a may be sequentially patterned to form a lower electrode 120b, a variable resistor 125a, and an upper electrode 130a that are sequentially stacked as illustrated in FIG. 3. The remaining metal pattern 110b, the upper metal pattern 116a, the lower electrode 120b, the variable resistor 125a, and the upper electrode 130a may be sequentially stacked in a direction perpendicular to the top surface of the substrate 100. Specifically, at least a portion of the remaining metal pattern 110b, at least a portion of the upper metal pattern 116a, and at least a portion of the variable resistor 125a may overlap with each other in a direction perpendicular to the top surface of the substrate 100. In addition, at least a portion of the remaining metal pattern 110b, at least a portion of the upper metal pattern 116a, at least a portion of the lower electrode 120b, at least a portion of the variable resistor 125a, and at least a portion of the upper electrode 130a may overlap with each other in a direction perpendicular to the top surface of the substrate 100.

Thereafter, an upper dielectric interlayer 132 may be formed as illustrated in FIG. 3. As illustrated in FIG. 3, a bit line plug 135 may be formed to penetrate the upper dielectric interlayer 135 and a bit line 140 may be formed on the upper dielectric interlayer 132, thereby implementing a semiconductor device.

Unlike the illustration, an uppermost metal pattern 116b and a lower conductive metal oxide pattern 115b discussed with reference to FIG. 1F may be applied instead of the upper metal pattern 116a. In these embodiments, a remaining metal pattern 110b, a lower conductive metal oxide pattern 115b, and an uppermost metal pattern 116b may be disposed, and a lower electrode 120b, a variable resistor 125a, and an upper electrode 130a may be sequentially stacked on the uppermost metal pattern 116b. Furthermore, unlike the embodiments discussed above, a planarized conductive metal oxide pattern 115a may replace the upper metal pattern 116a. In these embodiments, as illustrated in FIG. 1D, a remaining metal pattern 110b and a planarized conductive metal oxide pattern 115a may be disposed, and a lower electrode 120b, a variable resistor 125a, and an upper electrode 130a may be sequentially stacked on the planarized conductive metal oxide pattern 115a. The above elements of the semiconductor device may be selected and applied suitably according to the necessary characteristics of the semiconductor device.

According to some embodiments of the inventive concept, the variable resistor layer 125 may directly contact the top surface of the upper metal pattern 116a. These embodiments will be discussed below with respect to FIGS. 2A and 2B.

Figure 2A:
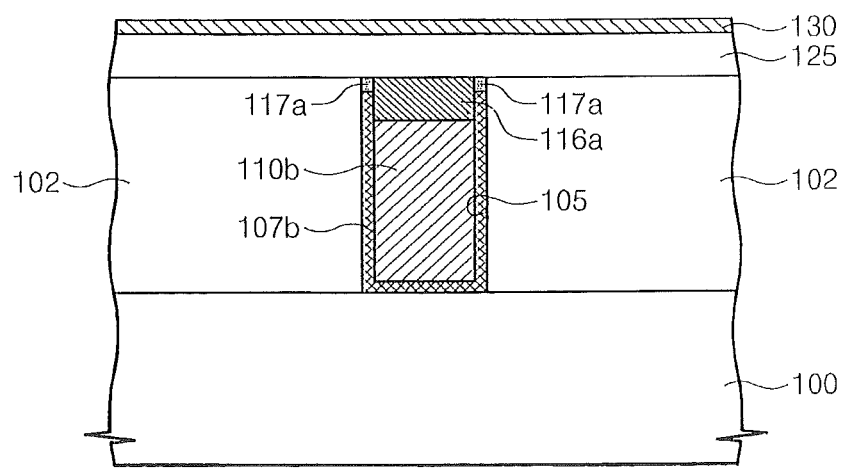
FIGS. 2A and 2B are cross-sections illustrating processing steps in the fabrication of semiconductor devices according to some embodiments of the inventive concept.
Figure 2B:
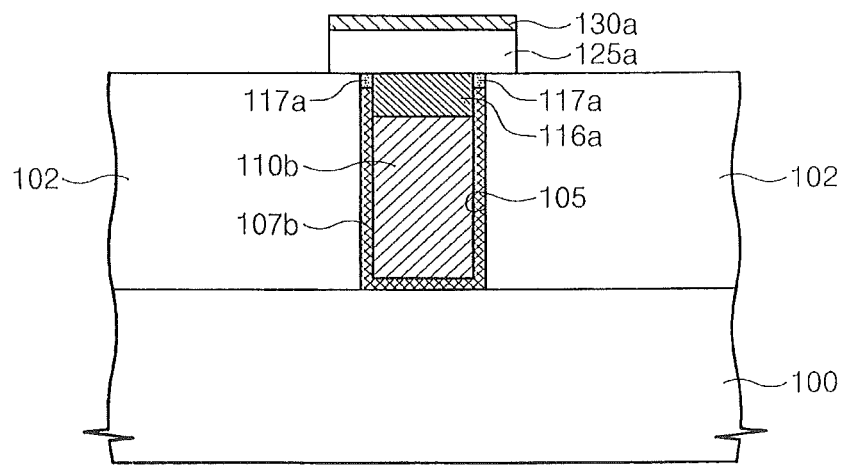

Referring now to FIGS. 2A and 2B, cross-sections illustrating processing steps in the fabrication of semiconductor device according to some embodiments of the inventive concept will be discussed. As illustrated in FIG. 2A, a cleaning process may be performed after the second planarization process discussed with reference to FIG. 1D. The cleaning process may be performed using acid chemicals including fluoric acid and/or sulfuric acid. A reduction process discussed with reference to FIG. 1E may be performed after the second planarization process. The reduction process may reduce the planarized conductive metal oxide pattern 115a as illustrated in FIG. 1E, or may reduce only a portion of the planarized conductive metal oxide pattern 115a as illustrated in FIG. 1F. Unlike this, the reduction process may be omitted.

Thereafter, a variable resistor layer 125 is formed on the substrate 100. The variable resistor layer 125 may directly contact the upper metal pattern 116a and the planarized dielectric interlayer 102. Thereafter, an upper electrode layer 130 is formed on the variable resistor layer 125.

Referring to FIG. 2B, the upper electrode layer 130 and the variable resistor layer 125 may be sequentially patterned to form a variable resistor 125a and an upper electrode 130a that are sequentially stacked. The variable resistor 125a contacts the upper metal pattern 116a and the planarized dielectric interlayer 102. Thereafter, an upper dielectric interlayer 132, a bit line plug 135, and a bit line 140 may be sequentially formed as illustrated in FIG. 3.

According to embodiments of the semiconductor device fabrication method discussed above, an oxidization process is performed on the metal pattern 110a to form the conductive metal oxide pattern 115, and a planarization process is performed on the upper portion of the conductive metal oxide pattern 115 and the upper portion of the dielectric interlayer 102. The conductive metal oxide pattern 115 is an oxide formed through the oxidization process. Accordingly, a difference between the etch rate of the conductive metal oxide pattern 115 and the etch rate of the dielectric interlayer 102 can be reduced in the planarization process. Consequently, a planarized surface including the top surfaces of the planarized conductive metal oxide pattern 115a and the planarized dielectric interlayer 102 can have very good flatness. Furthermore, it is possible to reduce the characteristic degradation of the variable resistor (125a of FIG. 3) formed on the planarized surface.

If the variable resistor is formed on a surface with poor flatness, the characteristics of the variable resistor may degrade. For example, if the variable resistor is a magnetic tunnel junction pattern, a Neel coupling may be generated to degrade the characteristics of the magnetic tunnel junction pattern. However, the semiconductor device according to some embodiments of the inventive concept is implemented to have a planarized surface with very good flatness, thereby minimizing the characteristic degradation of the variable resistor 125a.

In addition, the variable resistor layer 125 is formed on the amorphous lower electrode layer 120a. Accordingly, the abnormal growth of the variable resistor layer 125 can be reduced and the characteristic degradation of the variable resistor 125a can be reduced.

Furthermore, the lower electrode layer 120a may be planarized through the partial planarization process. Accordingly, the variable resistor 125a can be formed on a planarized surface with much better flatness. Consequently, it is possible to implement the variable resistor 125a with good characteristics.

Furthermore, according to embodiments of the semiconductor device fabrication method discussed above, a reduction process may be additionally performed on the planarized conductive metal oxide pattern 115a. In these embodiments, through the reduction process, at least a portion of the oxygen of the planarized conductive metal oxide pattern 115a may be removed to form the upper metal pattern 116a. The upper metal pattern 116a may have a lower resistivity than the conductive metal oxide pattern 115a because it has a higher metal content than the conductive metal oxide pattern 115 discussed with reference to FIG. 1C (or the planarized conductive metal oxide pattern 115a discussed with reference to FIG. 1D). The planarized conductive metal oxide pattern 115a and/or the upper metal pattern 116a may be selected and applied suitably according to the necessary resistivity levels of the semiconductor device. Furthermore, the resistivity of the conductive element formed through the reduction process may be controlled suitably according to the reduction levels of the planarized conductive metal oxide pattern 115a.

A semiconductor device according to some embodiments of the inventive concept will now be discussed with reference to FIG. 3. FIG. 3 is a cross-section of a semiconductor device according to some embodiments of the inventive concept. As illustrated in FIG. 3, a dielectric interlayer 102 is on a substrate 100, and a metal pattern 110b is in the dielectric interlayer 102. An upper metal pattern 116a is on the remaining metal pattern 110b. That is, the remaining metal pattern 110b is in an opening 105 penetrating the dielectric interlayer 102, and the upper metal pattern 116a is on the remaining metal pattern 110b and in the opening 105. The upper metal pattern 116a has a planarized top surface being coplanar with the top surface of the dielectric interlayer 102. A difference between a second height (H2 of FIG. 1D) of the top surface of the dielectric interlayer 102 and a first height (H1 of FIG. 1D) of the center of the upper metal pattern 116a from the top surface of the substrate 100 may be equal to or greater than about 0 Å and equal to or smaller than about 50 Å. Preferably, the difference between the first height H1 and the second height H2 may be equal to or greater than about 0 Å and equal to or smaller than about 10 Å. The upper metal pattern 116a may include the same metal as the remaining metal pattern 110b.

A barrier pattern 107b may be between the inner surface of the opening 105 and the remaining metal pattern 110b. The barrier pattern 107b may include an oxidized portion 117a. The oxidized portion 117a of the barrier pattern 107b may have a planarized top surface being coplanar with the planarized top surface of the upper metal pattern 116a. According to some embodiments, the oxidized portion 117a may be omitted.

A lower electrode 120b, a variable resistor 125a, and an upper electrode 130a may be sequentially stacked on the top surface of the upper metal pattern 116a. The variable resistor 125a is electrically connected to the upper metal pattern 116a. The lower electrode 120b may be in an amorphous state. The lower electrode 120b may extend horizontally on the dielectric interlayer 102 adjacent to the upper metal pattern 116a. In these embodiments, the lower electrode 120b may contact the oxidized portion 117a of the barrier pattern 107b. On the other hand, if the oxidized portion 117a of the barrier pattern 107b is omitted, the lower electrode 120b may contact the barrier pattern 107b. The remaining metal pattern 110b, the upper metal pattern 116a, the lower electrode 120b, the variable resistor 125a, and the upper electrode 130a may be sequentially stacked in a direction perpendicular to the top surface of the substrate 100. According to some embodiments, the lower electrode 120b may be omitted. In these embodiments, the variable resistor 125a may directly contact the upper metal pattern 116a as illustrated in FIG. 2B. Unlike this, the upper metal pattern 116a may be replaced with an uppermost metal pattern 116b and a conductive metal oxide pattern 115b illustrated in FIG. 1F, or with a planarized conductive metal oxide pattern 115a illustrated in FIG. 1D.

The variable resistor 125a may change into a plurality of resistance states with different resistivities. In these embodiments, the resistivity of the upper metal pattern 116a may be lower than the lowest among the resistivities of the resistance states of the variable resistor 125a. The upper metal pattern 116a may include the same metal as the remaining metal pattern 110b, and the grain size of the upper metal pattern 116a may be smaller than the grain size of the remaining metal pattern 110b. Thus, the resistivity of the upper metal pattern 116a may be somewhat higher than the resistivity of the remaining metal pattern 110b.

An upper dielectric interlayer 132 may be on the substrate 100, and a bit line plug 135 may be on the upper electrode 130a to penetrate the upper dielectric interlayer 132. A bit line 140 may be on the upper dielectric interlayer 132 to contact the bit line plug 135. The remaining metal pattern 110b and the bit line plug 135 may be sequentially stacked in the direction perpendicular to the top surface of the substrate 100.

Figure 4A:
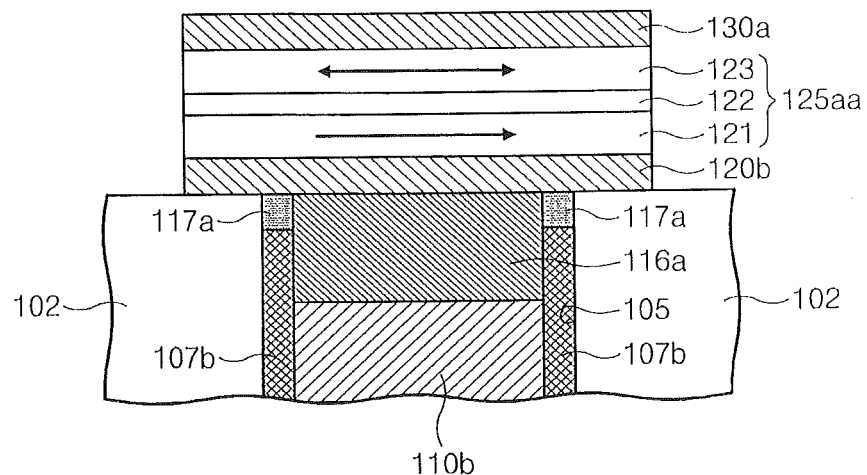
FIG. 4A is a cross-section illustrating a variable resistor in a semiconductor device according to some embodiments of the inventive concept.

The variable resistor 125a may be implemented in various shapes, which will be discussed below with respect to FIGS. 4A to 4C. Referring first to FIG. 4A, a cross-section illustrating a variable resistor in a semiconductor device according to some embodiments of the inventive concept will be discussed. As illustrated in FIG. 4A, a variable resistor 125aa may be a magnetic tunnel junction pattern including a reference layer 121 with a fixed magnetization direction, a free layer 123 with a variable magnetization direction, and a tunnel barrier layer 122 between the reference layer 121 and the free layer 123. The reference layer 121, the tunnel barrier layer 122, and the free layer may be sequentially stacked. Accordingly, the reference layer 121 may be connected to the lower electrode 120b, and the free layer 123 may be connected to the upper electrode 130a. Unlike this, the free layer 123, the tunnel barrier layer 122, and the reference layer 121 may be sequentially stacked, so that the free layer 123 may be connected to the lower electrode 120b and the reference layer 121 may be connected to the upper electrode 130a.

If the magnetization direction of the free layer 123 and the magnetization direction of the reference layer 121 are parallel to each other, the variable resistor 125aa has a first resistivity. On the other hand, if the magnetization direction of the free layer 123 and the magnetization direction of the reference layer 121 are antiparallel to each other, the variable resistor 125aa has a second resistivity higher than the first resistivity.

The magnetization direction of the free layer 123 may change by the spins of electrons in a current flowing through the variable resistor 125aa. For example, the magnetization direction of the free layer 123 may change by the spin direction of electrons accumulated in the free layer 123 and/or the interface between the free layer 13 and the tunnel barrier layer 122. The current direction of a first program arranging the magnetization directions of the free layer 123 and the reference layer 121 to be parallel to each other may be opposite to the current direction of a second program arranging the magnetization directions of the free layer 123 and the reference layer 121 to be antiparallel to each other.

The reference layer 121 may include a pinning layer for fixing the magnetization direction, and a pinned layer whose magnetization direction is fixed by the pinning layer. The pinning layer may be formed of anti-ferromagnetic material. The pinned layer may be formed of ferromagnetic material. The pinned layer is adjacent to the tunnel barrier layer 122.

The pinned layer may have a three-layer structure. For example, the pinned layer may include a first ferromagnetic layer, a second ferromagnetic layer, and a non-magnetic layer between the first ferromagnetic layer and the second ferromagnetic layer. The non-magnetic layer may be exchange-coupled to the first and second ferromagnetic layers. That is, the magnetization directions of the first and second ferromagnetic layers may be fixed by the non-magnetic layer to be antiparallel to each other. The magnetization direction of the first ferromagnetic layer may be fixed by the pinning layer, and the magnetization direction of the second ferromagnetic layer may be fixed by the non-magnetic layer to be antiparallel to the magnetization direction of the first ferromagnetic layer. The second ferromagnetic layer may be adjacent to the tunnel barrier layer 122. The non-magnetic layer may be formed of ruthenium.

The free layer 123 may include a single ferromagnetic layer. Unlike this, the free layer 123 may have a multi-layer structure. For example, the free layer 123 may include a first free layer, a second free layer, and a free non-magnetic layer between the first free layer and the second free layer. By the free non-magnetic layer, the first and second free layers may be exchange-coupled to each other. By the free non-magnetic layer, the magnetization directions of the first and second free layers may be arranged to be antiparallel to each other. For example, if the magnetization direction of the first free layer is arranged in a first direction, the magnetization direction of the second free layer may be arranged in a second direction antiparallel to the first direction. If the magnetization direction of the first free layer changes from the first direction to the second direction, the magnetization direction of the second free layer may change from the second direction to the first direction. The first and second free layers may be formed of ferromagnetic material, and the free non-magnetic layer may be formed of ruthenium. The tunnel barrier layer 122 may be formed of magnesium oxide and/or aluminum oxide.

Figure 4B:
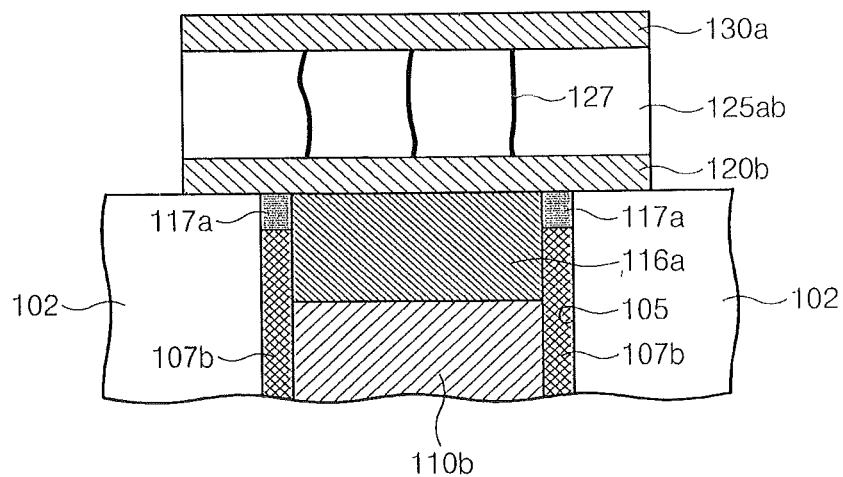
FIG. 4B is a cross-section illustrating a variable resistor in a semiconductor device according to some embodiments of the inventive concept.

Referring now to FIG. 4B, a cross-section illustrating a variable resistor in a semiconductor device according to some embodiments of the inventive concept will be discussed. As illustrated in FIG. 4B, a variable resistor 125ab may include at least one filament 127 that is created or destroyed. If the filament 127 is destroyed, the resistivity of the variable resistor 125ab is high. On the other hand, if the filament 127 is created, the resistivity of the variable resistor 125ab is low. Both ends of the filament 127 may be connected respectively to the lower electrode 120b and the upper electrode 130a. Depending on the number of the created filaments 127, the variable resistor 125ab may have three or more resistance states with different resistivities. In these embodiments, the variable resistor 125ab may store multi-bit data.

The variable resistor 125ab may include at least one selected from the group consisting of niobium oxide, titanium oxide, nickel oxide, zirconium oxide, vanadium oxide, PCMO(Pr,Ca)MnO$_3$), strontium-titanium oxide, barium-strontium-titanium oxide, strontium-zirconium oxide, barium-zirconium oxide, and barium-strontium-zirconium oxide. The filament 127 may the shape of a passage with connected vacancies. Unlike this, the filament 127 may have the shape of a metal bridge with metal atoms connected to each other.

Figure 4C:
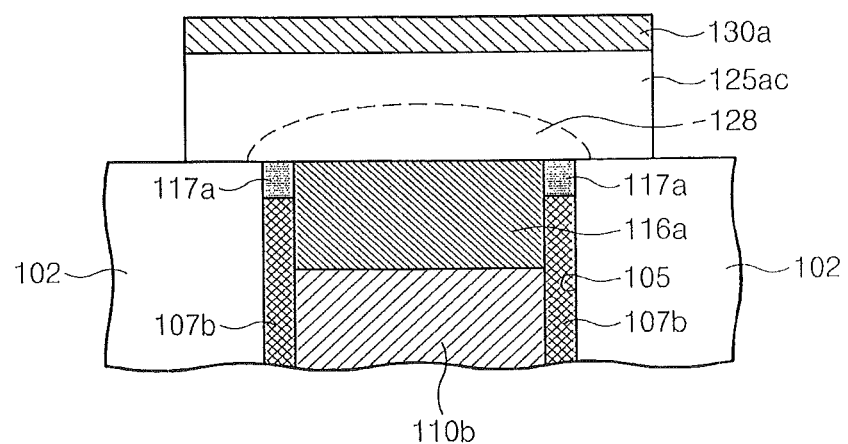
FIG. 4C is a cross-section illustrating a variable resistor in a semiconductor device according to some embodiments of the inventive concept.

Referring now to FIG. 4C, a cross-section illustrating a variable resistor in a semiconductor device according to some embodiments of the inventive concept will be discussed. As illustrated in FIG. 4C, a variable resistor 125ac may include a phase-change material containing at least one selected from the group consisting of tellurium (Te) and selenium (Se) that are chalcogenide elements. According to the temperature applied, the phase-change material may change into a crystalline state or an amorphous state. The crystalline phase-change material may have a lower resistivity than the amorphous phase-change material. For example, the variable resistor 125ac may include at least one selected from the group consisting of Ge—Sb—Te, As—Sb—Te, As—Ge—Sb—Te, Sn—Sb—Te, Ag—In—Sb—Te, In—Sb—Te, Group 5A element-Sb—Te, Group 6A element-Sb—Te, Group 5A element-Sb—Se, Group 6A element-Sb—Se, Ge—Sb, In—Sb, Ga—Sb, and doped Ge—Sb—Te. Herein, the doped Ge—Sb—Te may be doped with C, N, B, Bi, Si, P, Al, Dy, or Ti.

If the variable resistor 125ac includes the above materials, the lower electrode 120b of FIG. 3 may be omitted. Thus, the variable resistor 125ac may directly contact the upper metal pattern 116a. Accordingly, the upper metal pattern 116a may be used as a heater electrode. A program region 128 of the variable resistor 125ac may cover the top surface of the upper metal pattern 116a. The program region 128 may be a portion of the variable resistor 125ac. According to a program operation, the program region 128 may change into a crystalline state or an amorphous state. For example, by a current flowing through the upper metal pattern 116a and the variable resistor 125ac, joule heat may be generated in a region adjacent to the interface between the upper metal pattern 116a and the variable resistor 125ac. The generated heat is supplied to the program region 128. If the program region 128 is supplied with heat of temperatures around the melting point of the variable resistor 125ac and is then cooled rapidly, the program region 128 may change into an amorphous state. On the other hand, if the program region 128 is supplied with heat of temperatures around the crystallization temperature of the variable resistor 125ac and is then cooled slowly, the program region 128 may change into a crystalline state.

As discussed above, the variable resistor may be implemented in various types. Thus, the semiconductor device according to some embodiments of the inventive concept may be implemented as various semiconductor devices such as magnetic memory devices, phase-change memory devices, and/or resistive memory devices.

An experiment was performed to detect the characteristics of the semiconductor device according to some embodiments of the inventive concept. A sample 1 and a sample 2 were prepared for the experiment. The sample 1 is a magnetic memory device that does not undergo the oxidization process and the planarization process according to some embodiments of the inventive concept. For the sample 1, the lower electrode, the magnetic tunnel junction pattern, and the upper electrode were sequentially formed on the metal pattern 110a of FIG. 1B. The metal pattern 110a of the sample 1 was formed of tungsten, and the dielectric interlayer 102 of the sample 1 was formed of silicon oxide.

The sample 2 is a magnetic memory device that undergoes the oxidization process and the planarization process according to some embodiments of the inventive concept. For the sample 2, an oxidization process was performed on a tungsten pattern to form a conductive tungsten oxide pattern; the conductive tungsten oxide pattern and the dielectric interlayer were planarized; and the lower electrode, the magnetic tunnel junction pattern, and the upper electrode were formed and stacked on the resulting structure. The dielectric interlayer 102 of the sample 2 was formed of silicon oxide.

Except the above difference, the same processes were performed for the samples 1 and 2. The resistances according to the program states of the memory cells of the samples 1 and 2 were measured to draw distribution graphs of FIGS. 5A and 5B.

Figure 5A:
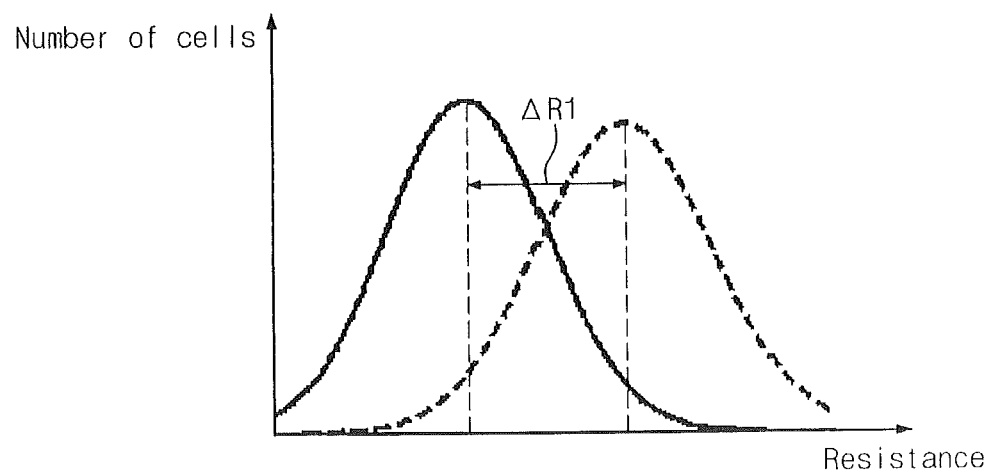
FIGS. 5A and 5B are distribution graphs illustrating the characteristics of semiconductor devices according to some embodiments of the inventive concept.
Figure 5B:
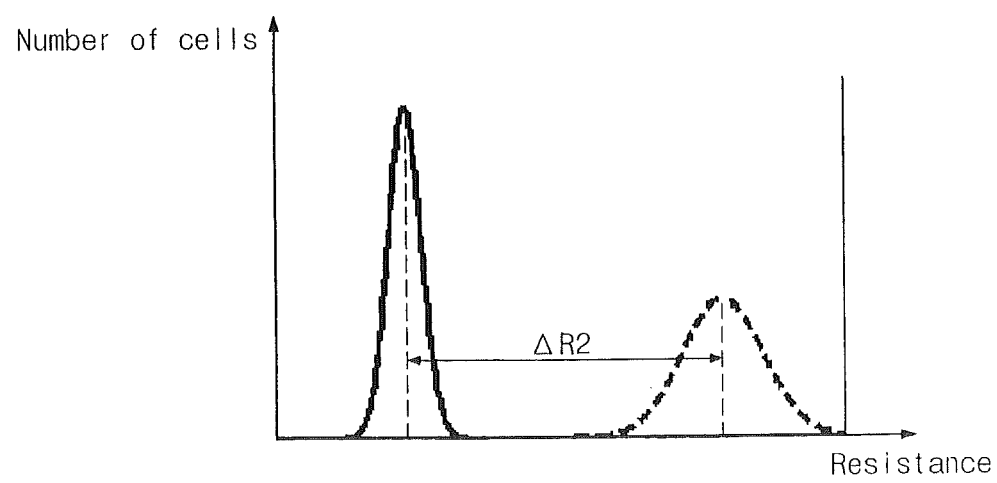

Referring now to FIGS. 5A and 5B, distribution graphs illustrating the characteristics of a semiconductor device according to some embodiments of the inventive concept will be discussed. FIG. 5A represents the resistance distribution of the memory cells of the sample 1, and FIG. 5B, represents the resistance distribution of the memory cells of the sample 2. In FIGS. 5A and 5B, the x axis represents resistance, and the y axis represents the number of memory cells.

Referring first to FIG. 5A, a solid line represents the distribution of resistance values that are measured after the memory cells of the sample 1 are programmed into first states with low resistivities, and a dotted line represents the distribution of resistance values that are measured after the memory cells of the sample 1 are programmed into second states with high resistivities.

A value (hereinafter referred to as a dispersion characteristic value), obtained by dividing the difference between the median value of the resistance distribution of the first state and the median value of the resistance distribution of the second state by 1 sigma of the resistance distribution of the first state, was used to detect the resistance dispersion characteristics. The number of malfunctioning memory cells increases as the dispersion characteristic value decreases. The dispersion characteristic value may be equal to or greater than about 6.

For the sample 1, a difference $\Delta R1$ between a median value of the solid line and a median value of the dotted line is about $1647\Omega$, and 1 sigma $\sigma$ of the solid line is about $847\Omega$. Thus, the dispersion characteristic value of the sample 1 is about 2.9. This shows that the sample 1 includes malfunctioning memory cells.

Referring to FIG. 5B, a solid line represents the distribution of resistance values that are measured after the memory cells of the sample 2 are programmed into the first state, and a dotted line represents the distribution of resistance values that are measured after the memory cells of the sample 2 are programmed into the second state.

For the sample 2, a difference $\Delta R2$ between a median value of the solid line and a median value of the dotted line is about $2115\,\Omega$, and 1 sigma $\sigma$ of the solid line is about $110\Omega$. Thus, the dispersion characteristic value of the sample 2 is about 20.1. Thus, the magnetic memory device of the sample 2 has good characteristics. That is, the magnetic memory device of the sample 2 does not include a malfunctioning memory cell. This shows that the semiconductor memory device according to some embodiments of the inventive concept has good characteristics.

Furthermore, as a result of checking the sections of the samples 1 and 2, the sample 1 has a height difference of about 100 Å between the center of a tungsten pattern and the top surface of a dielectric interlayer. Unlike this, for the sample 2, the average value of a height difference between the planarized top surface of a conductive metal oxide pattern (e.g., a tungsten metal oxide pattern) and the top surface of a dielectric interlayer is about 2 Å. This shows that the planarized surface according to some embodiments of the invention concept has very good flatness.

In addition, if a reduction process is additionally performed on the conductive metal oxide pattern (e.g., the tungsten metal oxide pattern) to form the upper metal pattern, the upper metal pattern may have a lower resistivity than the conductive metal oxide pattern. Thus, it can be seen that a magnetic memory device with a lower driving current is implemented.

A semiconductor device fabrication method according to some embodiments may include the processes discussed with reference to FIGS. 1A to 1C.

Figure 6A:
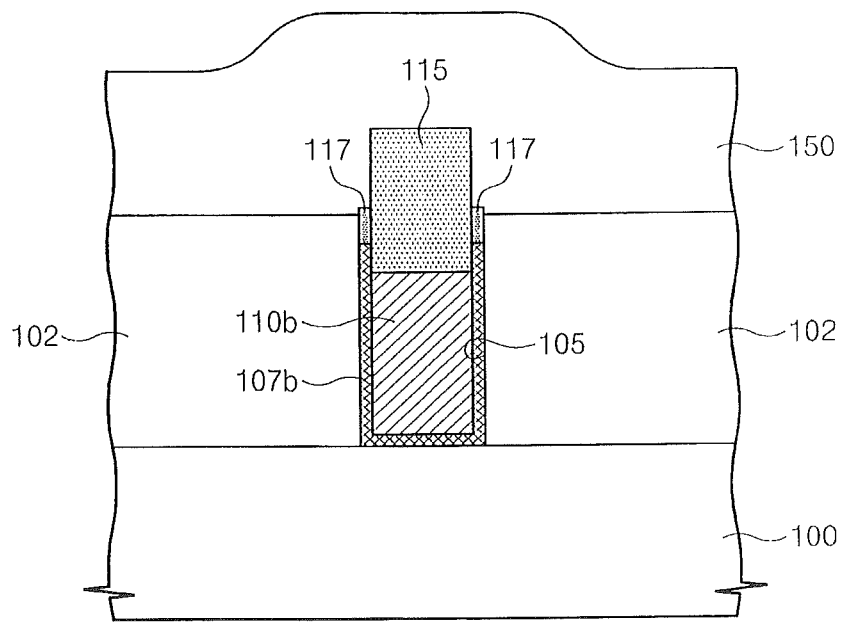
FIGS. 6A to 6E are cross-sections illustrating processing steps in the fabrication of semiconductor device's according to another embodiment of the inventive concept.

Referring now to FIGS. 6A to 6E, cross-sections illustrating processing steps in the fabrication of a semiconductor device according to some embodiments of the inventive concept will be discussed. As illustrated in FIGS. 1C and 6A, an oxidization process is performed to form a conductive metal oxide pattern 115, and a capping dielectric layer 150 is formed on a substrate 100. The capping dielectric layer 150 covers the sidewalls and the top surface of a portion protruding outside an opening 105 of the conductive metal oxide pattern 115. The capping dielectric layer 150 may be formed of oxide. For example, the capping dielectric layer 150 may be formed of silicon oxide, germanium oxide, and/or silicon-germanium oxide. The capping dielectric layer 150 may be formed through a high-density plasma process, a CVD process, and/or an ALE process.

Figure 6B:
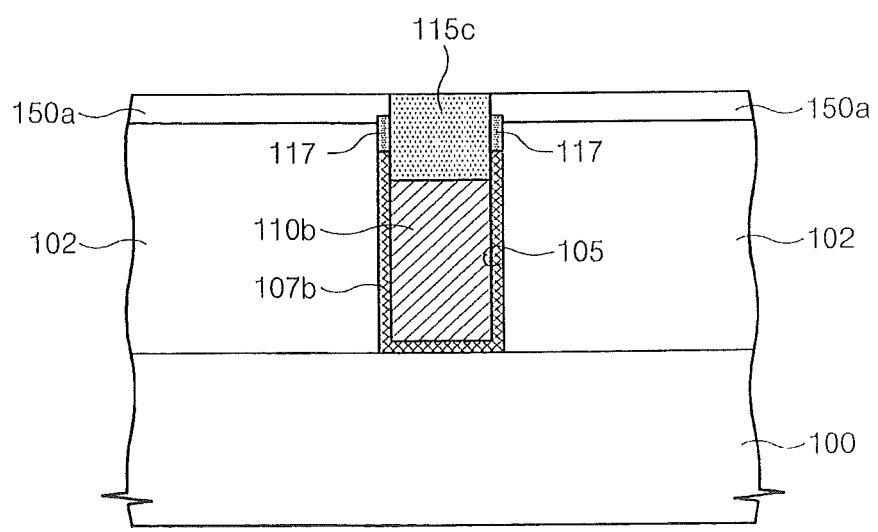

Referring to FIG. 6B, a planarization process is performed on the capping dielectric layer 150 and the conductive metal oxide pattern 115. The planarization process may be performed through a CMP process. After the planarization process, a portion of the capping dielectric layer 150 may remain on the substrate 100. The top surface of the planarized conductive metal oxide pattern 115c may be coplanar with the top surface of the planarized capping dielectric layer 150a. The capping dielectric layer 150 may be formed of oxide as discussed above. Furthermore, the conductive metal oxide pattern 115 may be formed of oxide through the oxidization process. Accordingly, the difference between the etch rate of the conductive metal oxide pattern 115 and the etch rate of the capping dielectric layer 150 is reduced in the planarization process. Consequently, the planarized surface resulting from the planarization process may have very good flatness. In the planarization process, the etch rate of the conductive metal oxide pattern 115 and the etch rate of the capping dielectric layer 150 may be substantially identical to each other.

The planarized capping dielectric layer 150a may cover a barrier pattern 107b. In addition, if an oxidized portion 117 of the barrier pattern is formed, the planarized capping dielectric layer 150a may cover the oxidized portion 117 of the barrier pattern.

Figure 6C:
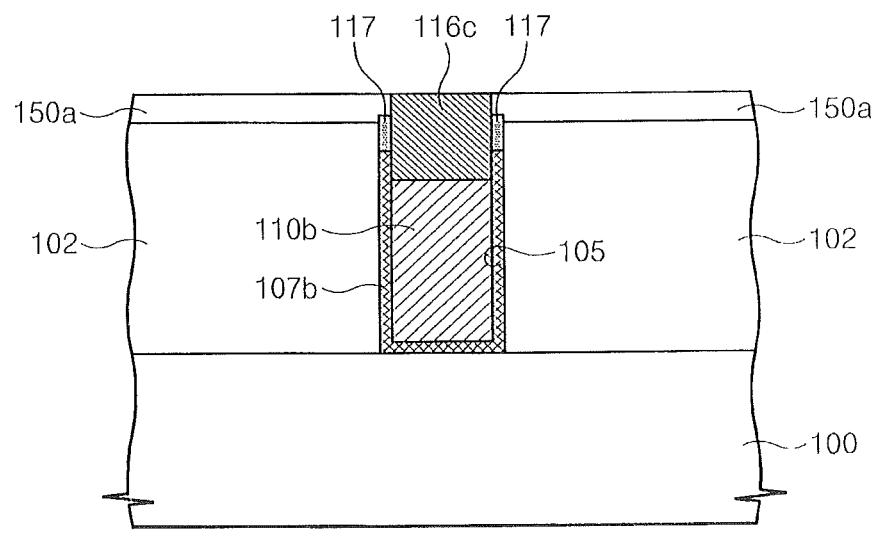

Referring to FIG. 6C, a reduction process is performed on the planarized conductive metal oxide pattern 115c. Through the reduction process, the planarized conductive metal oxide pattern 115c may be reduced to an upper metal pattern 116c. The reduction process may deoxidize the planarized conductive metal oxide pattern 115c. Thus, the upper metal pattern 116c may have a lower oxygen concentration than the planarized conductive metal oxide pattern 115c. That is, the upper metal pattern 116c may be in a stoichiometrically metal-richer state than the planarized conductive metal oxide pattern 115c. Accordingly, the upper metal pattern 116c may have a lower resistivity than the planarized conductive metal oxide pattern 115c. The oxygen content of the upper metal pattern 116c may depend on the process conditions of the reduction process. That is, if the reduction process on the planarized conductive metal oxide pattern 115c is performed sufficiently, the upper metal pattern 116c may not substantially include oxygen. On the other hand, if the reduction process on the planarized conductive metal oxide pattern 115c is performed insufficiently within a short time, the oxygen content of the planarized conductive metal oxide pattern 115c may be somewhat high. However, also in these embodiments, the oxygen content of the upper metal pattern 116c may be lower than the oxygen content of the planarized conductive metal oxide pattern 115c.

The upper metal pattern 116c may contain the same metal as the remaining metal pattern 110b. The upper metal pattern 116c may contain crystalline metal. The size of grains in the upper metal pattern 116c may be smaller than the size of grains in the remaining metal pattern 110b.

Figure 6D:
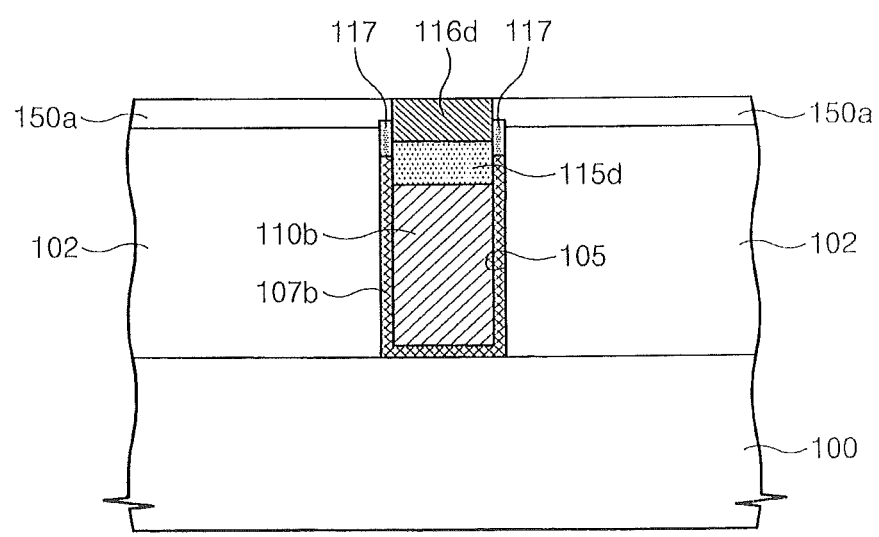

Unlike the illustration of FIG. 6C, only a portion of the planarized conductive metal oxide pattern 115c may be reduced through the reduction process. Referring to FIG. 6D, only an upper portion 115d of the planarized conductive metal oxide pattern 115c may be reduced to form an uppermost metal pattern 116b. Accordingly, the lower portion 115d of the planarized conductive metal oxide pattern 115c may remain as a lower conductive metal oxide pattern 115b without reduction, and may be between the uppermost metal pattern 116b and the remaining metal pattern 110b. In these embodiments, the lower conductive metal oxide pattern 115d may have a higher resistivity than the remaining metal pattern 110b and the uppermost metal pattern 116b.

The reduction process of the planarized conductive metal oxide pattern 115c may be identical to the reduction process on the planarized conductive metal oxide pattern 115a discussed with reference to FIG. 1E. Unlike this, the reduction process on the planarized conductive metal oxide pattern 115c may be omitted. Specifically, if it is designed to form a device needing a conductive element with a relatively high resistivity, the planarized conductive metal oxide pattern 115c may be applied to the device without reduction.

Figure 6E:
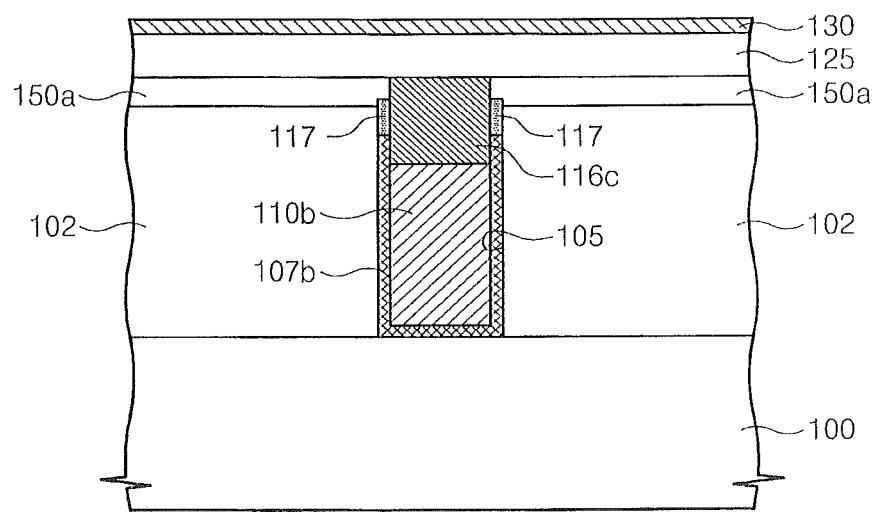

Referring to FIG. 6E, a variable resistor layer 125 may be formed on the upper metal pattern 116c and the planarized capping dielectric layer 150a, and an upper electrode layer 130 may be formed on the variable resistor layer 125. The variable resistor layer 125 may directly contact the top surface of the upper metal pattern 116c.

Figure 8:
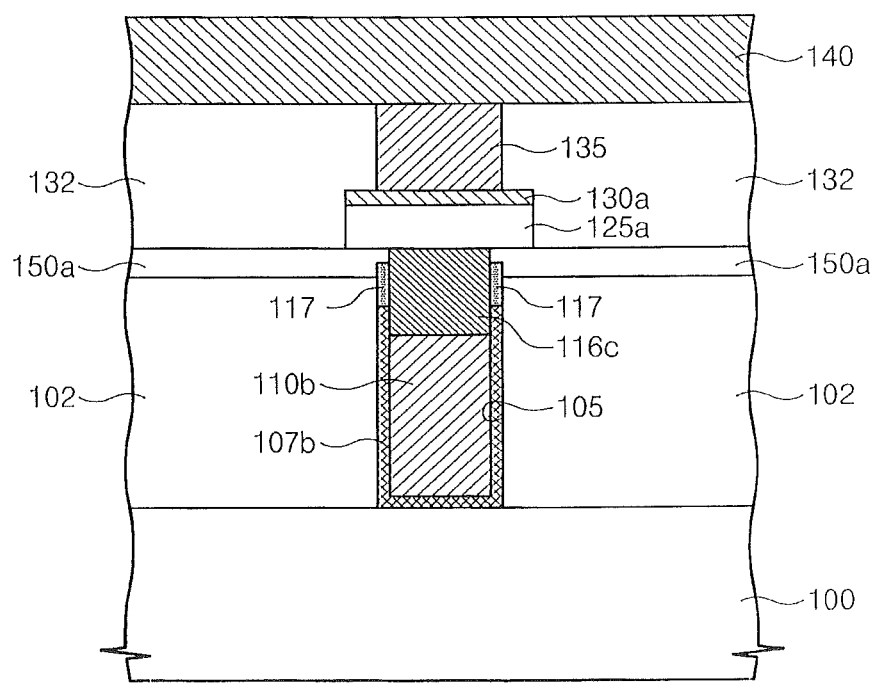
FIG. 8 is a cross-section of a semiconductor device according to some embodiments of the inventive concept.

The upper electrode pattern 130 and the variable resistor layer 125 may be sequentially patterned to form a variable resistor 125a and an upper electrode 130a that are sequentially stacked as illustrated in FIG. 8. Thereafter, an upper dielectric interlayer 132, a bit line plug 135, and a bit line 140 may be sequentially formed to implement a semiconductor device of FIG. 8.

On the other hand, embodiments discussed above, the upper electrode layer may be formed before the forming of the variable resistor layer 125. These embodiments will be discussed with respect to FIGS. 7A to 7C.

Figure 7A:
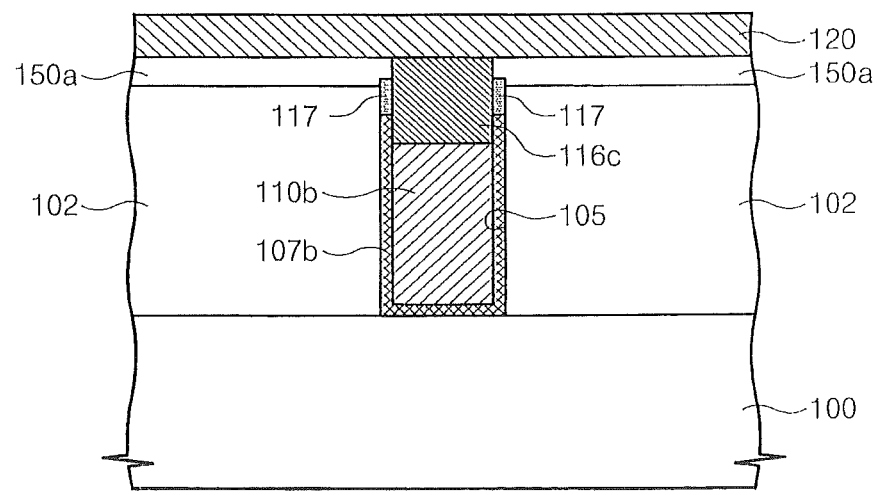
FIGS. 7A to 7C are cross-sections illustrating processing steps in the fabrication of semiconductor device's according to some embodiments of the inventive concept.
Figure 7B:
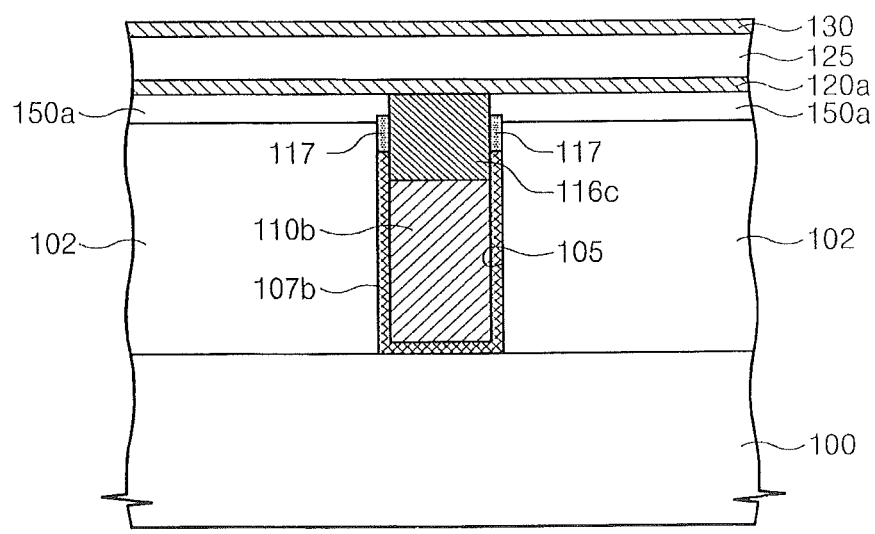
Figure 7C:
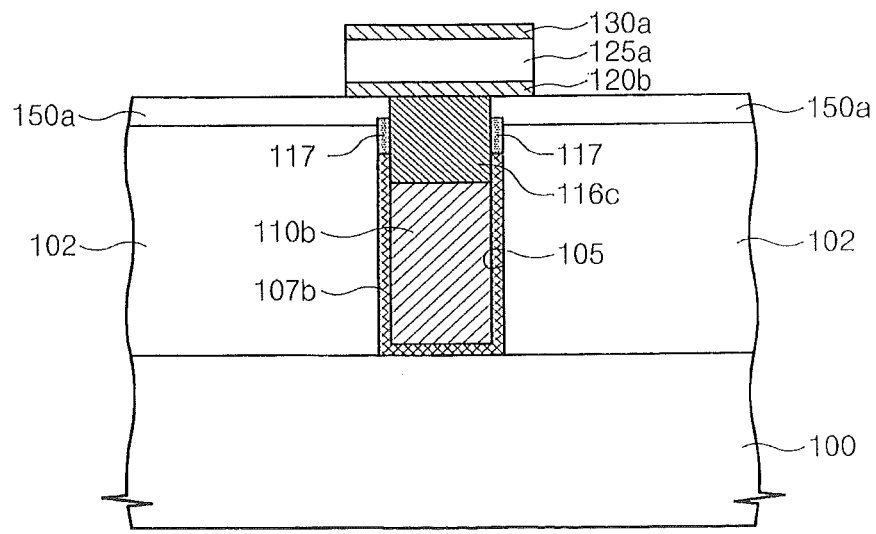

Referring now to FIGS. 7A to 7C, cross-sections illustrating processing steps in the fabrication of a semiconductor device according to some embodiments of the inventive concept will be discussed. As illustrated in FIGS. 7A and 7B, a lower electrode layer 120 may be formed on an upper metal pattern 116c and a capping dielectric layer 150a. A partial planarization process may be performed on the lower electrode layer 120. The partial planarization process may be performed through a CMP process. By the partial planarization process, the top surface of the planarized lower electrode layer 120a may have better flatness. According to some embodiments of the inventive concept, the partial planarization process may be omitted. A variable resistor layer 125 and an upper electrode layer 130 are sequentially formed on the planarized lower electrode layer 120a.

Referring to FIG. 7C, the upper electrode layer 130, the variable resistor layer 125, and the lower electrode layer 120a may be sequentially patterned to form a lower electrode 120b, a variable resistor 125a, and an upper electrode 130a that are sequentially stacked. In these embodiments, the lower electrode 120b may contact the top surface of the upper metal pattern 116c, and the variable resistor 125a may be electrically connected to the upper metal pattern 116c through the lower electrode 120b.

Referring to FIG. 8, a cross-section of a semiconductor device according to some embodiments of the inventive concept will be discussed. As illustrated in FIG. 8, dielectric layers 102 and 105a are on a substrate 100, and a metal pattern 110b is in the dielectric layers 102 and 105a. An upper metal pattern 116c is on the remaining metal pattern 110b. The upper metal pattern 116c contacts the top surface of the remaining metal pattern 110b. The upper metal pattern 116c has a planarized top surface being coplanar with the top surfaces of the dielectric layers 102 and 105a. The dielectric layers 102 and 105a may include a dielectric interlayer 102 surrounding the side walls of the remaining metal pattern 110b and the lower sidewalls of the upper metal pattern 116c, and a capping dielectric layer 150a surrounding an upper portion of the upper metal pattern 116c. The top surface of the upper metal pattern 116c may be coplanar with the top surface of the capping dielectric layer 150a. The remaining metal pattern 110b may be in an opening 105 penetrating the dielectric interlayer 102, a lower portion of the upper metal pattern 116c may be in the opening 105, and an upper portion of the upper metal pattern 116c may be disposed outside the opening 105. The capping dielectric layer 150a may surround the sidewalls of the upper metal pattern 116c outside the opening 105.

The center of the top surface of the upper metal pattern 116c is located at a first height from the top surface of the substrate 100, and the top surface of the capping dielectric layer 150a is located at a second height from the top surface of the substrate 100. The difference between the first height and the second height may be equal to or smaller than about 0 Å and equal to or greater than about 50 Å. Preferably, the difference between the first height and the second height may be equal to or smaller than about 0 Å and equal to or greater than about 10 Å.

A barrier pattern 107b may be between the remaining metal pattern 110b and the dielectric layers 102 and 150a. The barrier pattern 107b may be between the inner surface of the opening 105 and the remaining metal pattern 110b. An oxidized portion 117 of the barrier pattern may be on the barrier pattern 107b between the inner sidewall of the opening 105 and the remaining metal pattern 110b. The capping dielectric layer 150a may cover the barrier pattern 107b. Furthermore, the capping dielectric layer 150a may cover the oxidized portion 117 of the barrier pattern. A portion of the oxidized portion 117 of the barrier pattern may extend outside the opening 105. The oxidized portion 117 outside the opening 105 may be between a portion of the capping dielectric layer 150a and the upper metal pattern 116c.

A variable resistor 125a and an upper electrode 130a may be sequentially on the upper metal pattern 116c. The variable resistor 125a may directly contact the top surface of the upper metal pattern 116c. Furthermore, an edge of the variable resistor 125a may contact the planarized top surface of the capping dielectric layer 150a. Unlike this, a lower electrode 120b may be between the variable resistor 125a and the upper metal pattern 116c as illustrated in FIG. 7C.

An upper dielectric interlayer 132 may cover the entire surface of the substrate 100, and a bit line plug 135 may be connected to the upper electrode 130a by penetrating the upper dielectric interlayer 132. A bit line 140 may be on the upper dielectric interlayer 132 to connect to the bit line plug 135. The variable resistor 125a may be one of the variable resistors 125aa, 125ab and 125ac discussed with reference to FIGS. 4A to 4C.

The semiconductor devices according to some embodiments discussed above may be implemented in various types of semiconductor packages. Examples of the packages of the semiconductor memory devices according to some embodiments of the inventive concept include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In. Package (SIP), Multi Chip Package (MCP), Wafer-level Fabricated Package (WFP), and Wafer-level Processed Stack Package (WSP). The package mounted with the semiconductor memory devices according to some embodiments of the inventive concept may further include a logic device and/or a controller that controls the semiconductor memory device.

Figure 9:
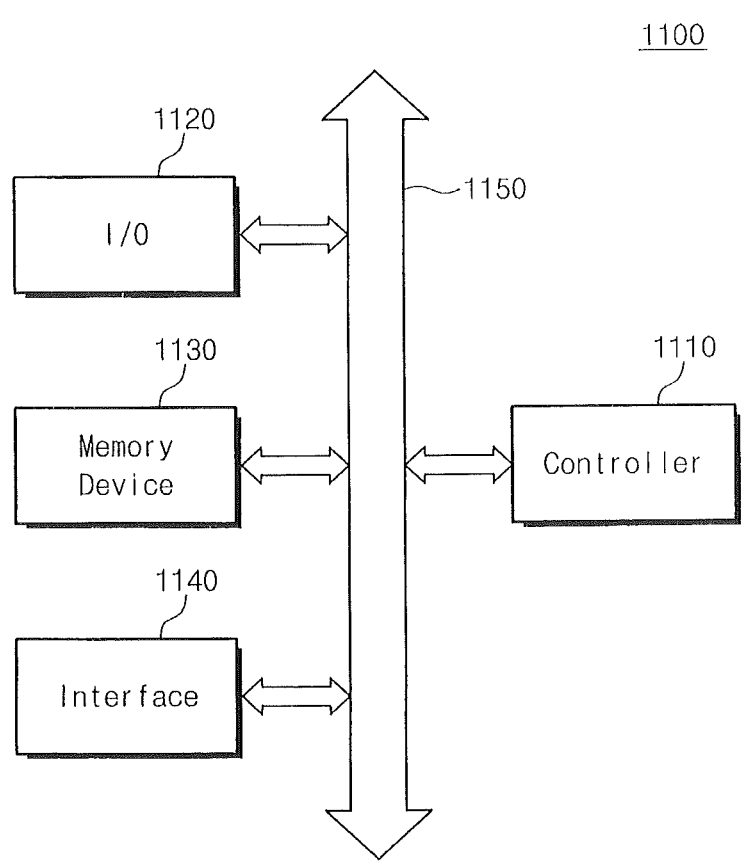
FIG. 9 is a block diagram of an electronic system including semiconductor memory devices according to some embodiments of the inventive concept.

Referring now to FIG. 9, a block diagram of an electronic system including a semiconductor memory device according to some embodiments of the inventive concept will be discussed. As illustrated in FIG. 9, an electronic system 1100 according to some embodiments the inventive concept may include a controller 1110, an input/output (I/O) device 1120 (e.g., a keypad, a keyboard, and a display), a memory device 1130, an interface 1140, and a bus 1150. The controller 1110, the I/O device 1120, the memory device 1130, and/or the interface 1140 may be connected to each other through the bus 1150. The bus 1150 corresponds to a data transfer path.

The controller 1110 may include at least one of a microprocessor, a digital signal processor, a microcontroller, and other logic devices capable of performing the similar function thereof. The I/O device 1120 may include a keyboard unit, a keypad unit, and/or a display unit. The memory device 1130 may store data and/or commands. The memory device 1130 may include at least one of the semiconductor memory devices according to embodiments of the inventive concept discussed above. The memory device 1130 may further include other types of semiconductor memory devices such as flash memory devices, DRAM devices, and/or SRAM devices. The interface 1140 may serve to transmit/receive data to/from a communication network. The interface 1140 may be a wired or wireless type. For example, the interface 1140 may include an antenna or a wired/wireless transceiver. Although not shown in FIG. 9, the electronic system 1100 may further include a high-speed DRAM and/or an SRAM as a working memory for improving an operation of the controller 1110.

The electronic system 1100 may be applicable to PDAs, portable computers, Web tablets, wireless phones, mobile phones, digital music players, memory cards, or any electronic device that can transmit and/or receive information in wireless environments.

Figure 10:
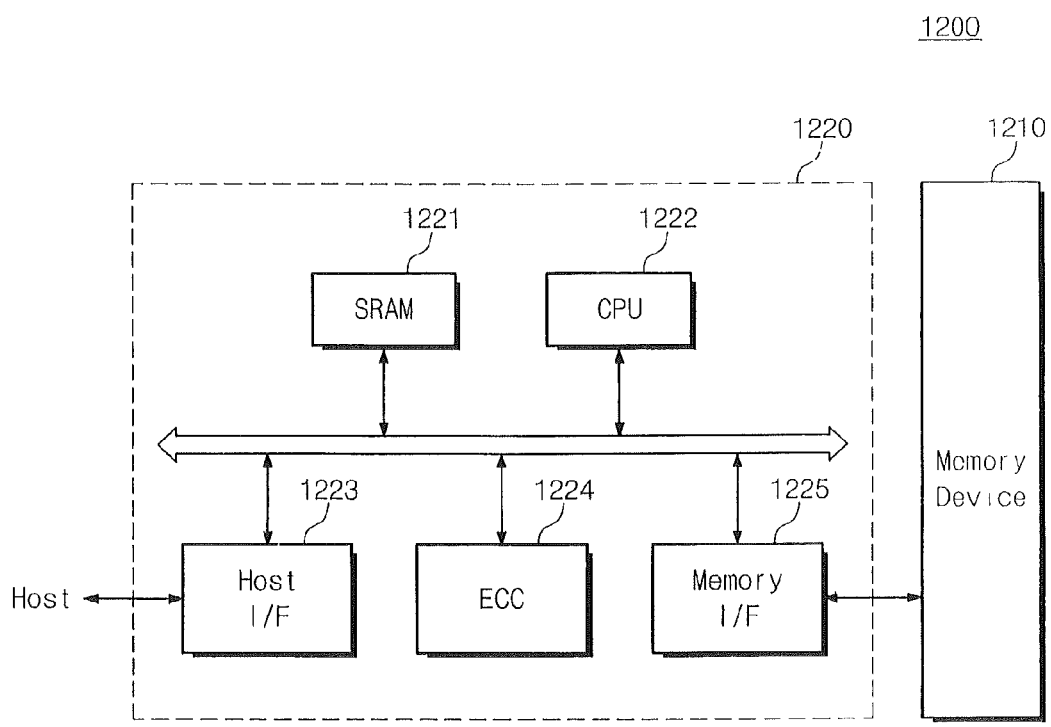
FIG. 10 is a block diagram of a memory card including semiconductor memory devices according to some embodiments of the inventive concept.

Referring now to FIG. 10, a block diagram of a memory card including a semiconductor memory device according to some embodiments of the inventive concept will be discussed. As illustrated in FIG. 10, a memory card 1200 according to some embodiments of the inventive concept may include a memory device 1210. The memory device 1210 may include at least one of the semiconductor memory devices according to the embodiments discussed above. Furthermore, the memory device 1210 may further include other types of semiconductor memory devices (e.g., flash memory devices, DRAM devices and/or SRAM devices). The memory card 1200 may include a memory controller 1220 that controls data exchange between a host and the memory device 1210.

The memory controller 1220 may include a processing unit (e.g., CPU) 1222 that controls an overall operation of the memory card 1200. Furthermore, the memory controller 1220 may further include an SRAM 1221 that is used as a working memory of the processing unit 1222. Furthermore, the memory controller 1220 may further include a host interface (I/F) 1223 and a memory interface (I/F) 1225. The host interface 1223 may have a protocol for data exchange between the memory card 1200 and the host. The memory interface 1225 may connect the memory controller 1220 and the memory device 1210. Furthermore, the memory controller 1220 may further include an error correction code (ECC) block 1224. The ECC block 1224 may detect and correct an error in data read from the memory device 1210. Although not shown in FIG. 12, the memory card 1200 may further include a ROM device that stores code data for interfacing with the host. The memory card 1200 may be used as a portable data storage card. Unlike this, the memory card 1200 may also be implemented by a solid state disk (SSD) that can replace a hard disk of a computer system.

As discussed above, an oxidization process is performed on a metal pattern to form a conductive metal oxide pattern, and the conductive metal oxide pattern is planarized. The conductive metal oxide pattern is an oxide that is formed by the oxidization process. Accordingly, it is possible to reduce the difference between the planarization etch rate of the conductive metal oxide pattern and the planarization etch rate of an adjacent dielectric layer. Consequently, it is possible to implement a flat surface with good flatness.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device comprising:
   a dielectric layer on a substrate;
   a metal pattern in the dielectric layer;
   a conductive metal-containing pattern on the metal pattern, the conductive metal-containing pattern including a same metal as the metal pattern and having a planarized top surface being coplanar with a top surface of the dielectric layer; and
   a variable resistor on the conductive metal-containing pattern and electrically connected to the conductive metal-containing pattern,
   wherein the conductive metal-containing pattern comprises a conductive metal oxide pattern adjacent to the metal pattern and an upper metal pattern on the conductive metal oxide pattern; and
   wherein an oxygen concentration of the conductive metal oxide pattern is higher than an oxygen concentration of the upper metal pattern.

2. The semiconductor device of claim 1, wherein the upper metal pattern further comprises nitrogen.

3. The semiconductor device of claim 1, wherein the variable resistor directly contacts the planarized top surface of the conductive metal-containing pattern.

4. The semiconductor device of claim 1, further comprising a barrier pattern between the dielectric layer and the metal pattern.

5. The semiconductor device of claim 4, wherein the dielectric layer comprises:
   a dielectric interlayer surrounding a sidewall of a lower portion of the conductive metal-containing pattern and a sidewall of the metal pattern; and
   a capping dielectric layer surrounding a sidewall of an upper portion of the conductive metal-containing pattern,
   wherein the capping dielectric layer covers the barrier pattern.

6. The semiconductor device of claim 1:
   wherein the variable resistor changes into a plurality of resistance states having different associated resistivities; and
   wherein a resistivity of the conductive metal-containing pattern is lower than a lowest among the resistivities of the resistance states.

7. A semiconductor device comprising:
   a dielectric layer on a substrate;
   a metal pattern in the dielectric layer;
   a conductive metal-containing pattern on the metal pattern, the conductive metal-containing pattern including a same metal as the metal pattern and having a planarized top surface being coplanar with a top surface of the dielectric layer;
   a variable resistor on the conductive metal-containing pattern and electrically connected to the conductive metal-containing pattern; and
   an amorphous lower electrode between the top surface of the conductive metal-containing pattern and the variable resistor.

8. A semiconductor device comprising:
   a dielectric layer on a substrate;
   a first metal pattern in the dielectric layer;
   a second metal pattern on the first metal pattern, the second metal pattern including a same metal as the first metal pattern, and having a planarized top surface being coplanar with the a surface of the dielectric layer; and
   a variable resistor on the second metal pattern and electrically connected to the second metal pattern,
   wherein a grain size of the second metal pattern is smaller than a grain size of the first metal pattern.

9. The semiconductor device of claim 8, wherein the second metal pattern further comprises nitrogen.

10. The semiconductor device of claim 8, wherein the second metal pattern further comprises oxygen.

* * * * *